(12) United States Patent
Arslan et al.

(10) Patent No.: US 10,853,187 B2
(45) Date of Patent: *Dec. 1, 2020

(54) JOINT DE-DUPLICATION-ERASURE CODED DISTRIBUTED STORAGE

(71) Applicant: Quantum Corporation, San Jose, CA (US)

(72) Inventors: Suayb S. Arslan, Irvine, CA (US); Turguy Goker, Irvine, CA (US); Roderick B. Wideman, Shakopee, MN (US)

(73) Assignee: Quantum Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/285,320

(22) Filed: Feb. 26, 2019

(65) Prior Publication Data

US 2019/0188087 A1    Jun. 20, 2019

Related U.S. Application Data

(63) Continuation of application No. 15/211,208, filed on Jul. 15, 2016, now Pat. No. 10,318,389.

(51) Int. Cl.
*G06F 11/14* (2006.01)
*H03M 13/11* (2006.01)
(Continued)

(52) U.S. Cl.
CPC ....... *G06F 11/1453* (2013.01); *H03M 13/033* (2013.01); *H03M 13/1102* (2013.01);
(Continued)

(58) Field of Classification Search
CPC ............ G06F 11/1453; G06F 2201/84; H03M 13/033; H03M 13/1102; H03M 13/356; H03M 13/3761; H03M 13/1177
See application file for complete search history.

(56) References Cited

U.S. PATENT DOCUMENTS 7,161,506 B2   1/2007   Fallon
7,378,992 B2   5/2008   Fallon
(Continued)

OTHER PUBLICATIONS

Rajaraman et al., EG-LDPC codes for the erasure wiretap channel, IEEE, Conference Paper, Pertinent pp. 1-5. (Year: 2010)*

(Continued)

*Primary Examiner* — April Y Blair
*Assistant Examiner* — Dipakkumar B Gandhi
(74) *Attorney, Agent, or Firm* — Eschweiler & Potashnik, LLC

(57) ABSTRACT

Methods and apparatus deduplicate and erasure code a message in a data storage system. One example apparatus includes a first chunking circuit that generates a set of data chunks from a message, an outer precoding circuit that generates a set of precoded data chunks and a set of parity symbols from the set of data chunks, a second chunking circuit that generates a set of chunked parity symbols from the set of parity symbols, a deduplication circuit that generates a set of deduplicated data chunks by deduplicating the set of precoded chunks or the set of chunked parity symbols, an unequal error protection (UEP) circuit that generates an encoded message from the set of deduplicated data chunks, and a storage circuit that controls the data storage system to store the set of deduplicated data chunks, the set of parity symbols, or the encoded message.

27 Claims, 11 Drawing Sheets

(51) Int. Cl.
*H03M 13/03* (2006.01)
*H03M 13/35* (2006.01)
*H03M 13/37* (2006.01)
*G06F 11/22* (2006.01)

(52) U.S. Cl.
CPC ..... *H03M 13/1177* (2013.01); *H03M 13/356* (2013.01); *H03M 13/3761* (2013.01); *G06F 2201/84* (2013.01)

(56) References Cited

U.S. PATENT DOCUMENTS

| | | | |
|---|---|---|---|
| 7,415,530 | B2 | 8/2008 | Fallon |
| 8,140,930 | B1* | 3/2012 | Maru ................. H03M 13/1122 |
| | | | 714/752 |
| 8,643,513 | B2 | 2/2014 | Fallon |
| 9,054,728 | B2 | 6/2015 | Fallon |
| 9,116,833 | B1 | 8/2015 | Rakitzis et al. |
| 9,116,908 | B2 | 8/2015 | Fallon |
| 9,292,384 | B2 | 3/2016 | Jin et al. |
| 9,503,127 | B2 | 11/2016 | Wideman et al. |
| 9,692,452 | B2 | 6/2017 | Wideman et al. |
| 2003/0037298 | A1* | 2/2003 | Eleftheriou .......... H03M 13/118 |
| | | | 714/752 |
| 2004/0010742 | A1 | 1/2004 | Williamson |
| 2004/0093549 | A1* | 5/2004 | Song ................. H03M 13/1111 |
| | | | 714/752 |
| 2005/0283708 | A1* | 12/2005 | Kyung .............. H03M 13/6393 |
| | | | 714/758 |
| 2006/0085726 | A1 | 4/2006 | Rhee |
| 2006/0212782 | A1 | 9/2006 | Li |
| 2007/0011565 | A1* | 1/2007 | Kim ..................... H03M 13/116 |
| | | | 714/758 |
| 2007/0033483 | A1* | 2/2007 | Jeong ..................... H03M 13/11 |
| | | | 714/758 |
| 2007/0180295 | A1 | 8/2007 | Byrne |
| 2008/0151724 | A1 | 6/2008 | Anderson et al. |
| 2008/0155191 | A1 | 6/2008 | Anderson et al. |
| 2009/0106625 | A1* | 4/2009 | Jun ........................ G11B 20/18 |
| | | | 714/758 |
| 2009/0132619 | A1 | 5/2009 | Arakawa |
| 2009/0199071 | A1* | 8/2009 | Graef ................. H03M 13/1111 |
| | | | 714/757 |
| 2010/0153181 | A1 | 6/2010 | Altunbasak |
| 2010/0211847 | A1* | 8/2010 | Livshitz ............. H03M 13/1111 |
| | | | 714/752 |
| 2011/0066628 | A1 | 3/2011 | Jayaraman |
| 2012/0066563 | A1* | 3/2012 | Obata ................. H03M 13/1111 |
| | | | 714/752 |
| 2013/0036278 | A1 | 2/2013 | Strzelczak et al. |
| 2014/0101512 | A1 | 3/2014 | Djordjevic |
| 2014/0157079 | A1 | 6/2014 | Park |
| 2014/0228077 | A1 | 8/2014 | Ku |
| 2014/0372585 | A1 | 12/2014 | Hui et al. |
| 2015/0058582 | A1 | 2/2015 | Baldwin et al. |
| 2015/0236716 | A1 | 8/2015 | Fukuda |
| 2015/0378820 | A1 | 12/2015 | Doerner |
| 2017/0102993 | A1 | 4/2017 | Hu |
| 2017/0257119 | A1 | 9/2017 | Wideman et al. |

OTHER PUBLICATIONS

Li et al., Design of LDPC codes for non-contiguous OFDM-based communication systems, IEEE, Conference Paper, Pertinent pp. 4712-4716 (Year: 2012)*

Freeland Systems, Insights, Why we love cloud storage, p. 2. (Year: 2015)*

Zigangirov et al., Partially-regular LDPC codes with linear encoding complexity and improved thresholds, IEEE, Conference Paper, pp. 528-532. (Year: 2011).*

Xiao, et al., "CodePlugin: Plugging Deduplication into Erasure Coding for Cloud Storage", Jul. 2015, HotCloud'15, 7th USENIX Workshop in Hot Topics in Cloud Computing, pp. 1-6.

IEEE 100, "The Authoritative Dictionary of IEEE Standards Terms", 2000, Seventh Edition, IEEE Standards Information Network, IEEE Press, pp. 1, 2, 124, 155, 168, 207, 273, 323, 574, 684.

Non-Final Office Action dated May 31, 2016 for U.S. Appl. No. 14/326,774.

Notice of Allowance dated Jul. 27, 2016 for U.S. Appl. No. 14/326,774.

Non-Final Office Action dated Oct. 5, 2016 for U.S. Appl. No. 15/227,285.

Notice of Allowance dated Feb. 27, 2017 for U.S. Appl. No. 15/227,285.

Non-Final Office Action dated Jul. 12, 2018 for U.S. Appl. No. 15/211,208.

Notice of Allowance dated Jan. 28, 2019 for U.S. Appl. No. 15/211,208.

* cited by examiner

JOINT DE-DUPLICATION-ERASURE CODED DISTRIBUTED STORAGE

REFERENCE TO RELATED APPLICATION

This Application is a Continuation of U.S. application Ser. No. 15/211,208, filed on Jul. 15, 2016, the contents of which are hereby incorporated by reference in their entirety.

BACKGROUND

Data deduplication seeks to remove redundancy within a data set by representing an original set of symbols in a smaller set of code symbols. By representing data with a reduced number of code symbols, data storage space and communication capacity usage are improved, which may in turn reduce cost. However, the lack of redundancy in deduplicated data causes some unique data identified during deduplication to be less protected than other unique data with respect to storage media failures, errors, erasures, or other loss. Over time, some unique data may become more or less valuable than other unique data. For example, one piece of unique data may be used to recreate hundreds of documents while another piece of unique data may only be used to recreate a single document.

Data de-duplication reduces the storage space requirements and improves the performance of data storage operations by eliminating duplicate copies of repeating data. De-duplication may involve dividing a larger piece of data into smaller pieces of data. Larger pieces of data may be referred to as "blocks" while the smaller pieces of data may be referred to as "sub-blocks" or "chunks". Dividing blocks into sub-blocks or chunks may be referred to as "chunking". De-duplication may be referred to as "dedupe".

One type of chunk-based de-duplication is inline de-duplication. Inline chunk-based de-duplication may de-duplicate data based on variable sized chunks before the de-duplicated data is written to a storage device. For a backup application, no knowledge of the backed-up data format is needed when using inline chunk-based de-duplication. One of the challenges of chunk-based de-duplication is the identification of repeating patterns. Once a sub-block has been created, there are different approaches for determining whether the sub-block is a duplicate sub-block, whether the sub-block can be represented using a delta representation, whether the sub-block is a unique sub-block, and so on. One approach for determining whether a sub-block is unique involves hashing the sub-block and comparing the hash to hashes associated with previously encountered and/or stored sub-blocks. Different hash functions may yield more or less unique determinations due, for example, to a collision rate associated with the hash function. Since different hashing schemes may yield more or less unique determinations, the different hashing approaches may also have different performance levels and may yield different amounts of data reduction. Conventional approaches to de-duplication have typically preferred strong hash functions amenable to simple implementation in order to minimize collisions.

Conventionally, chunks are tagged with specific indexes or IDs based on a relatively stronger class of hash functions. A strong hash function is hash function that for a given pair of keys, has a low probability of hashing to the same index. A weak hash function is a hash function that for a given pair of keys, has a higher probability of hashing to the same index. In a deduplication system, hash-based IDs are typically stored in a hash table or a chunk index (ID) table. The hash table or chunk ID table stores reference counts and pointers to where unique chunks are stored on disk or other storage medium. Since IDs are compared to identify identical chunks to be stored or not stored, hash collisions may compromise data integrity. Using larger hash tags can reduce the frequency of hash collisions, but at the cost of consuming more memory. To maintain fast chunk ID lookup, hash tables or chunk index files are typically stored in a medium that has faster access than the medium in which the de-duplicated data will be stored. For example, the hash table may be stored in a Random Access Memory (RAM) while the de-duplicated data may be stored on disk or tape. However, at large scales, the hash table or chunk ID table containing the chunk IDs may increase in size and eventually overflow the amount of RAM available. When this happens, the remaining chunk ID table data is paged to disk or other storage media that has a slower access time than RAM. Paging the remaining index data to disk may cause delays and reduces de-duplication throughput, and is known as the chunk look-up disk bottleneck problem.

Erasure coding creates additional redundant data to produce code symbols that protect against 'erasures' where data portions that are lost can be reconstructed from the surviving data. Adding redundancy introduces overhead that consumes more storage capacity or transmission bandwidth, which in turn adds cost. The overhead added by erasure code (EC) processing tends to increase as the protection level provided increases.

An erasure code is a forward error correction (FEC) code for the binary erasure channel. An FEC facilitates transforming a message of k symbols into a longer message with n symbols such that the original message can be recovered from a subset of the n symbols, k and n being integers. The original message may be, for example, a file. The fraction r=k/n is called the code rate, and the fraction k'/k, where k' denotes the number of symbols required for recovery, is called the reception efficiency. Optimal erasure codes have the property that any k out of the n code word symbols suffice to recover the original message with a reception efficiency of unity. Optimal codes may require extensive memory usage, CPU time, or other resources when n is large and the code rate is low.

Erasure codes are described in coding theory. Coding theory is the study of the properties of codes and their fitness for a certain purpose (e.g., backing up files). Codes may be used for applications including, for example, data compression, cryptography, error-correction, and network coding. Coding theory involves data compression, which may also be referred to as source coding, and error correction, which may also be referred to as channel coding. Fountain codes are one type of channel erasure code.

Some storage systems may employ rateless erasure code technology (e.g., fountain codes) to provide a flexible level of data redundancy. The appropriate or even optimal level of data redundancy produced using a rateless erasure code system may depend, for example, on the number and type of devices available to the storage system. The actual level of redundancy achieved using a rateless erasure code system may depend, for example, on the difference between the number of readable redundancy blocks (e.g., erasure code symbols) written by the system and the number of redundancy blocks needed to reconstruct the original data. For example, if twenty redundancy blocks are written and only eleven redundancy blocks are needed to reconstruct the original data that was protected by generating and writing the redundancy blocks, then the original data may be reconstructed even if nine of the redundancy blocks are damaged or otherwise unavailable.

Fountain codes have the property that a potentially limitless sequence of code symbols may be generated from a given set of source symbols in a manner that supports ideally recovering the original source symbols from any subset of the code symbols having a size equal to or larger than the number of source symbols. A fountain code may be optimal if the original k source symbols can be recovered from any k encoding symbols, k being an integer. Fountain codes may have efficient encoding and decoding algorithms that support recovering the original k source symbols from any k' of the encoding symbols with high probability, where k' is just slightly larger than k (e.g., an overhead or reception efficiency close to unity). A rateless erasure code is distinguished from an erasure code that exhibits a fixed code rate.

An EC system may be described using an A/B notation, where B describes the total number of encoded symbols that can be produced for an input message and A describes the minimum number of the B encoded symbols that are required to recreate the message for which the encoded symbols were produced. By way of illustration, in a 10 of 16 configuration, or EC 10/16, sixteen encoded symbols could be produced. The 16 encoded symbols could be spread across a number of drives, nodes, or geographic locations. The 16 encoded symbols could even be spread across 16 different locations. In the EC 10/16 example, the original message could be reconstructed from 10 verified encoded symbols.

In a storage system, reliability and efficiency are two main concerns. One of the main objectives of distributed storage or cloud storage is to ensure the reliable protection of user data. The reliability of the protection of user data may be referred to as Partition Tolerance within the Consistency-Availability-Partition Tolerance (CAP) terminology. Many storage systems trade off Availability against Consistency or vice versa, but not against Partition Tolerance. However, reliability and efficiency are often conflicting goals. Greater reliability may be achieved at the cost of reduced efficiency. Higher efficiency may be attained at the cost of reduced reliability. De-duplication is typically used to reduce unwanted redundancy, while erasure coding inserts a controlled redundancy in a data storage system to meet a durability constraint on the data storage system's operation. Thus, conventionally there has been no reason to use deduplication and erasure coding together. Some approaches to using deduplication and erasure coding together include the erasure coding of deduplicated data. However, if a data storage system is suffering from the chunk look-up disk bottleneck problem, resources devoted to erasure coding may go unused while waiting for the chunk look-up disk bottleneck to resolve, deduplication throughput may be reduced, and time may be wasted. Thus, some approaches to using deduplication and erasure coding together offer suboptimal performance and use of resources.

BRIEF DESCRIPTION OF THE DRAWINGS

The accompanying drawings, which are incorporated in and constitute a part of the specification, illustrate various example apparatus, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Example methods and apparatus improve on conventional data storage approaches by employing de-duplication in conjunction with unequal error protection (UEP) erasure coding to provide space and time efficient operation of a distributed data storage system. Example methods and apparatus merge data stream compression with channel codes or erasure correction coding to facilitate flexible and reliable data storage. Example methods and apparatus employ inline chunk-based de-duplication interleaved with multiple pre-coding stages, along with basic fountain codes to improve on conventional approaches by providing a more efficient failure tolerance, by reducing the frequency and impact of hash collisions, and by providing an improved solution to the chunk-lookup disk bottleneck problem.

Figure 1:
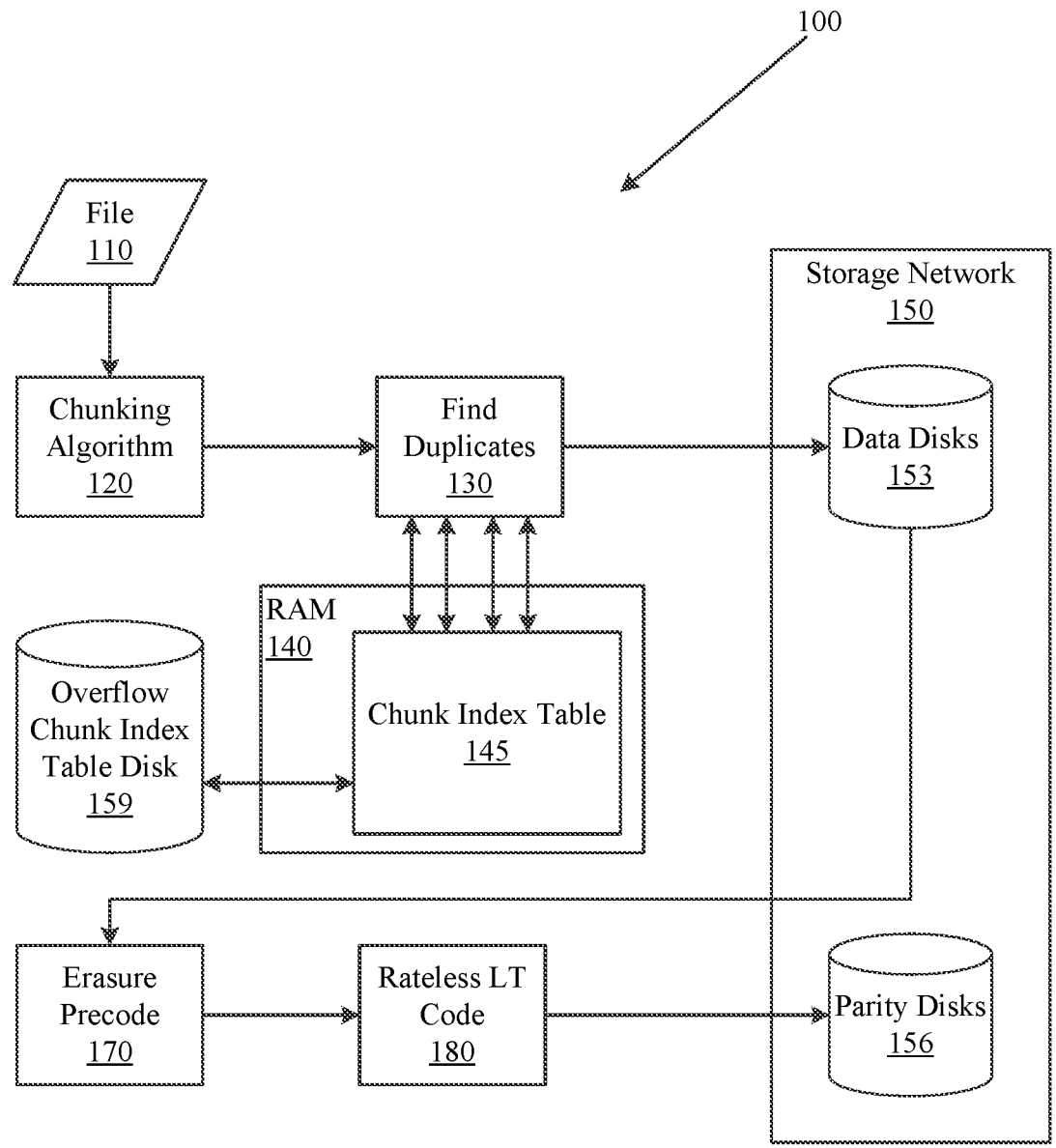
FIG. 1 illustrates a workflow diagram of an approach to data de-duplication and erasure coding.

Data storage approaches may add redundancy to de-duplicated user data using systematic fountain codes in a serial manner. Systematic erasure codes do not incur a decode penalty when reading back data that has not encountered any erasures (e.g., no data has been corrupted or lost) since some of the encoded symbols are actually just the plaintext symbols from the original message. FIG. 1 is a workflow diagram of a data storage approach 100 that adds redundancy using de-duplication combined with systematic fountain codes. A file 110 is chunked by the variable length chunking algorithm 120. A strong hash is then generated for a chunk in order to identify the chunk. Data storage approach 100, at 130, finds duplicate chunks stored in a data storage network 150 by comparing the hash of the chunk to a chunk index table 145 stored in RAM 140. The chunk index table 145 stores hashes of chunks that have been stored in the storage network 150. Data storage approach 100 then stores the de-duplicated chunks in a plurality of data disks 153 or other storage media present in the storage network 150. The de-duplicated chunks are then processed using an erasure precode 170. The erasure precoded de-duplicated chunks are then input to a rateless Luby Transform (LT) code 180 to generate an encoded message. The encoded message is then stored in parity disks 156.

As illustrated in FIG. 1, conventional approaches store the chunk index table 145 in RAM 140. Conventional approaches typically use strong hash functions to generate the chunk index or chunk ID used to identify the chunked data because stronger hash functions typically provide a lower probability that different chunks will hash to the same index. Since hash collisions may compromise data integrity, or even result in a complete loss of data, conventional approaches try to avoid hash collisions. However, stronger hashes require more resources to compute, more bandwidth to transmit, and more storage space to store. Furthermore, as the number of chunks increases, or the size of the stronger hashes increases, more RAM is consumed by the chunk ID table. The chunk ID table may eventually overflow, at which point the remaining index data is paged to a different storage device, typically a disk, which has slower access time than RAM. This paging reduces the deduplication throughput.

Conventional data storage approaches may attempt to solve the chunk-lookup disk bottleneck problem by using various techniques. These various techniques may include sparse indexing or extreme binning. One approach to sparse indexing is described in M. Lillibridge et al., "Sparse Indexing: Large scale, inline deduplication using sampling and locality," in *Proc. of the Eighth USENIX Conf. on File and Storage Tech.* (*FAST*), February 2009, pp. 111-123. One approach to extreme binning is described in D. Bhagwat et al., "Extreme binning: scalable, parallel deduplication for chunk-based file backup," in *Proc. 17th IEEE International Symposium on Modeling, Analysis, and Simulation of Computer and Telecommunications Systems,* 2009. However, both sparse indexing and extreme binning result in a de-duplication performance loss. In addition they do not address reliability (erasure coding) or efficiency (deduplication) problems at the same time. Conventional approaches are thus sub-optimal in their approach to managing the chunk-lookup disk bottleneck problem.

Figure 2:
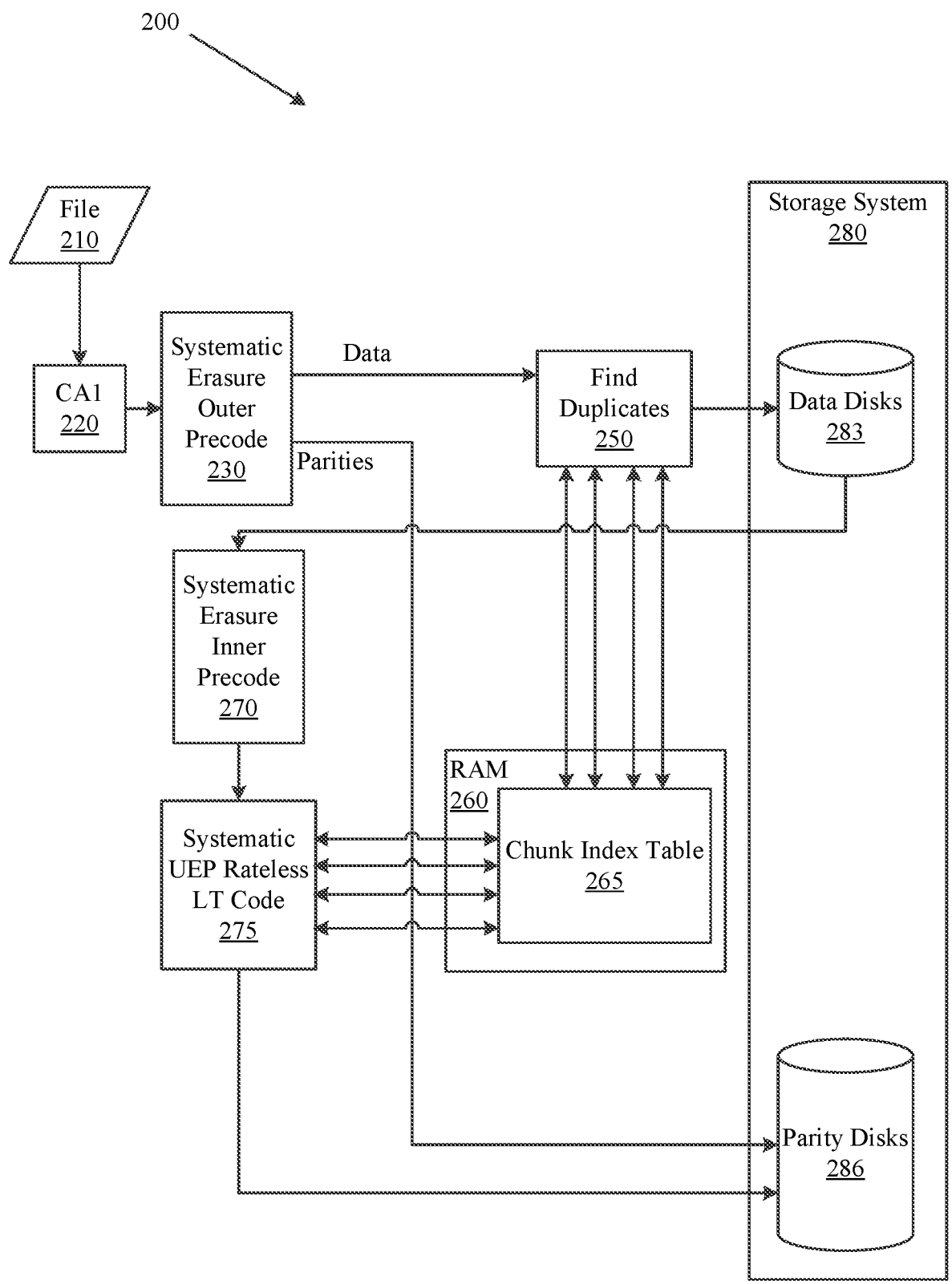
FIG. 2 illustrates an example workflow diagram of one embodiment of joint de-duplication and erasure coded distributed storage.

FIG. 2 illustrates an example workflow diagram of an example data storage approach 200 using joint de-duplication and erasure coded distributed storage methods and apparatus as described herein. A file 210 is chunked by a first chunking approach (CA1) 220. The chunked file is input to a systematic erasure outer precode 230, which generates a set of outer precoded data chunks, and a set of parities. The systematic erasure outer precode 230 may use a selectively adaptable low density parity check (LDPC) matrix. The set of parities is stored in a parity disk 286 that is part of a distributed data storage system 280. Data storage approach 200, at 250, deduplicates the set of outer precoded data chunks using a weak hash to generate a set of unique data chunks. The deduplication process or apparatus 250 finds duplicate chunks stored in the distributed data storage system 280 by comparing the hash of the chunk to hashes stored in a chunk index table 265 stored in RAM 260. The chunk index table 265 stores hashes of chunks that have been stored in the distributed data storage system 280. The chunk index table may be implemented as a key-value store. The deduplication apparatus or process 250 uses a weak hash, in contrast to conventional approaches that use a strong hash to prevent collisions. By using a weaker hash to identify a chunk, example methods and apparatus reduce the memory required to store chunk IDs in the chunk ID table 265, reduce the bandwidth needed to access the chunk ID table 265, and reduce the processing resources required to generate and compare hashes. For example, a weaker hash may facilitate a simpler search, in which a hash comparison may be implemented as an efficient search on logarithmic time balanced binary trees. Thus, in one example involving a search algorithm with an O/(log n) run time, if a weak hash is w bits long, while a strong hash is s bits long, using weak hashing instead of strong hashing may result in an s/w increase in search speed. In other embodiments, other types of efficient search may be used. Data storage approach 200 then stores the de-duplicated chunks in a plurality of data disks 283 or other storage media present in the distributed storage system 280. The de-duplicated chunks are then processed using systematic erasure inner precode 270. The inner precoded de-duplicated chunks are then input to a systematic unequal error protection (UEP) rateless Luby Transform (LT) code 275 to generate an encoded message. The encoded message is then stored in parity disks 286. In one embodiment, the rate of the LT code can be adjusted on the fly.

Figure 3:
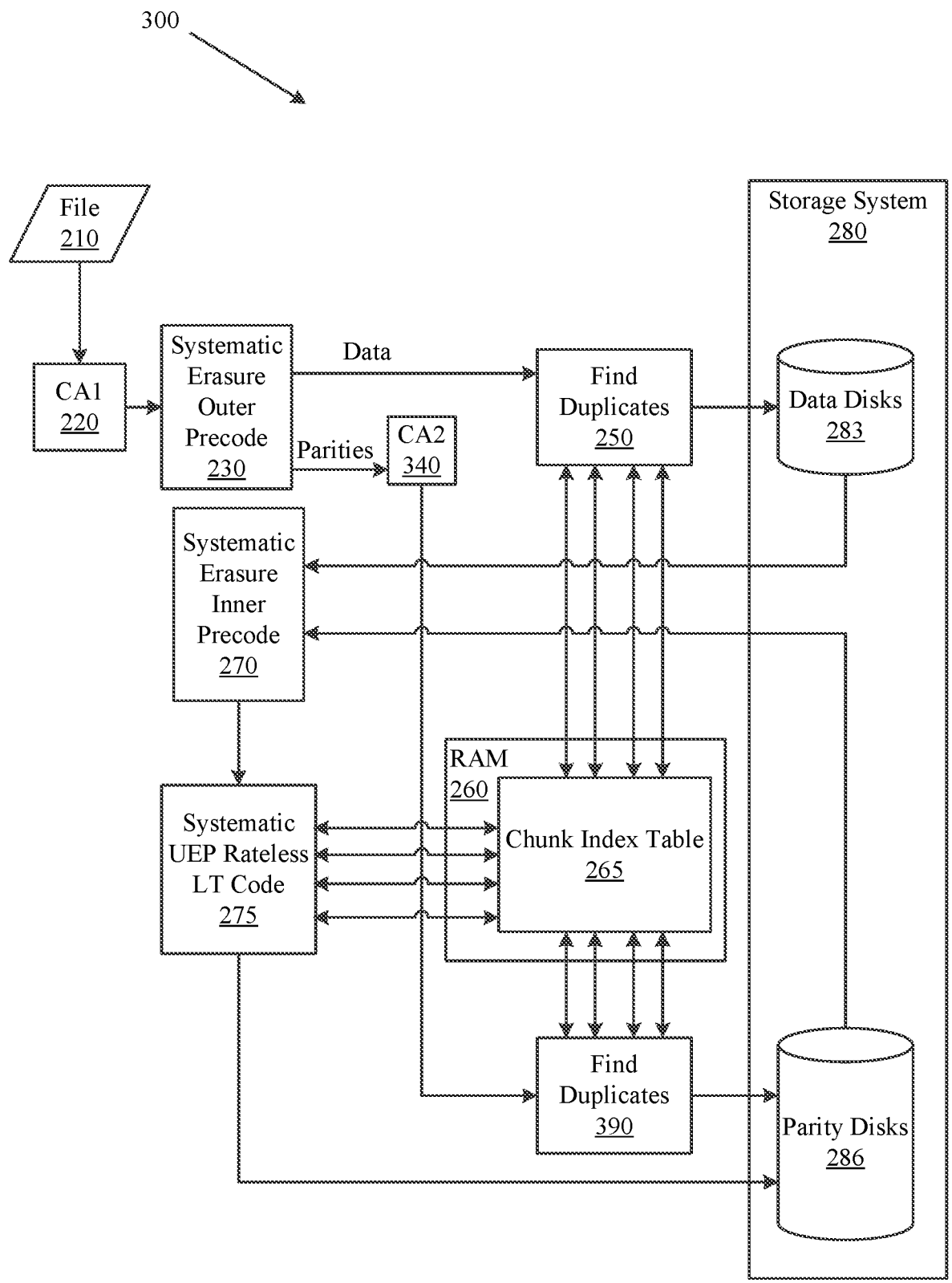
FIG. 3 illustrates an example workflow diagram one embodiment of joint de-duplication and erasure coded distributed storage.

FIG. 3 illustrates an example workflow diagram of one example data storage approach 300 using joint de-duplication and erasure coded distributed storage methods and apparatus as described herein. The data storage approach 300 is similar to data storage approach 200, but has additional elements and further reduces the data storage requirements of distributed storage system 280. Data storage approach 300, chunks the set of parities at 340 using a second chunking approach to generate a set of chunked parities. The set of chunked parities may be deduplicated at 390 to generate a set of unique parities. The deduplication approach taken at 390 may employ different parameters than the deduplication approach used at 250. Since parities exhibit more difference or dissimilarity within parity chunks than do data chunks, reducing the chunk size at 390 may facilitate identifying duplicate parity chunks. The chunk size for parity blocks may be adjusted based on a deduplication ratio, or other parameter. The set of unique parities may be stored in parity disks 286, or may be further processed. For example, the set of unique parities may be input to the systematic erasure inner precode 270 to generate a set of inner precoded unique parities. The set of inner precoded unique parities may be erasure encoded at 275 by the systematic UEP rateless LT code to generate a set of erasure coded parities. The set of erasure coded parities may be stored in the parity disks 286.

Figure 11:
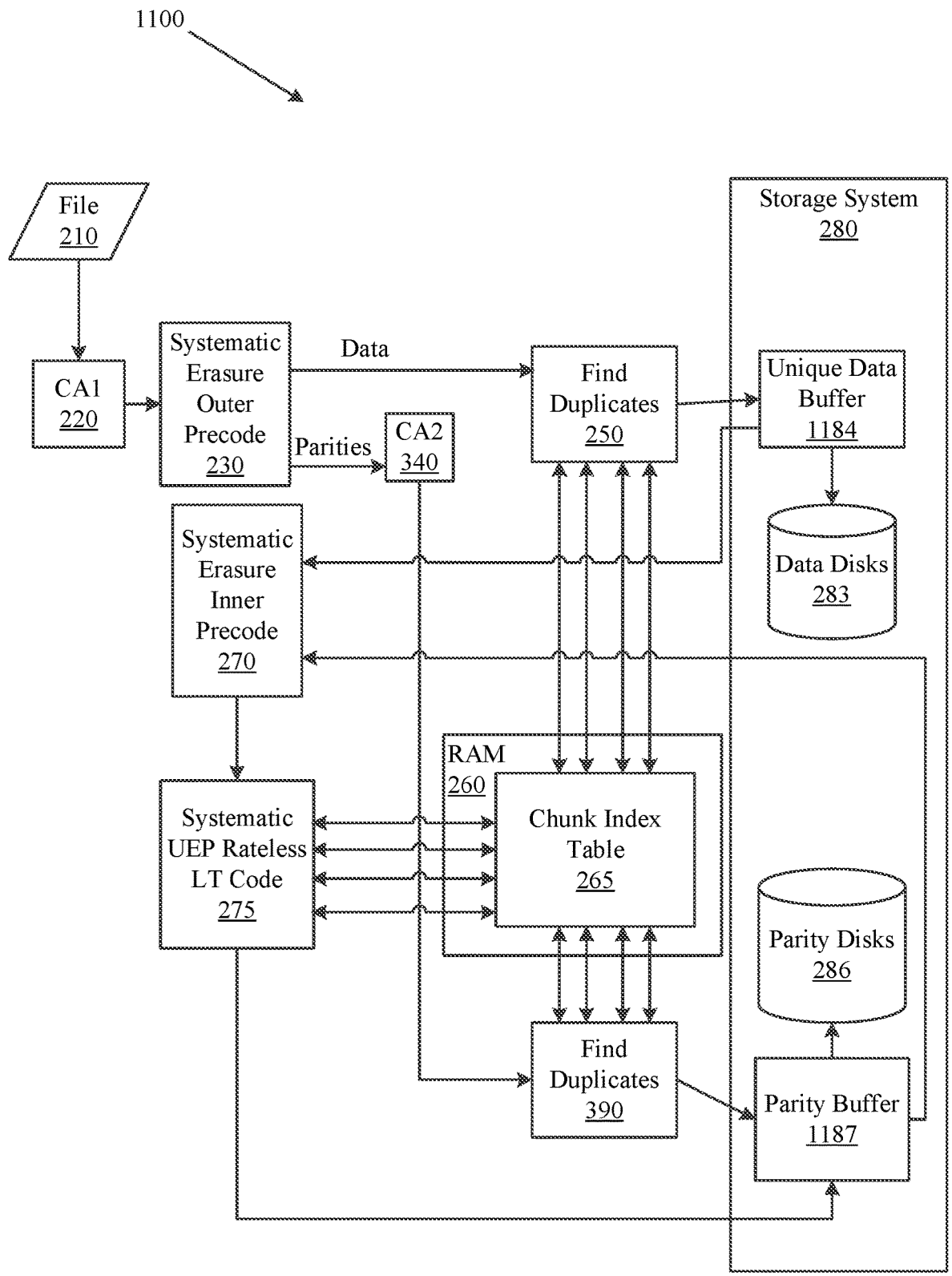
FIG. 11 illustrates an example workflow diagram one embodiment of joint de-duplication and erasure coded distributed storage.

FIG. 11 illustrates an example workflow diagram of one example data storage approach 1100 using joint de-duplication and erasure coded distributed storage methods and apparatus as described herein. The data storage approach 1100 is similar to data storage approaches 200 and 300, but has additional elements and further increases the performance of example methods and apparatus. Data storage approach 1100 includes storing unique data chunks in a unique data buffer 1184. Unique data buffer 1184 may be a RAM buffer. By storing unique data chunks in the unique data buffer 1184, data storage approach 1100 avoids having to access the data disks 283 when conducting erasure precoding. Data stored in the unique data buffer 1184 may be written to the data disks 283. Data storage approach 1100 also includes a parity buffer 1187. Parity buffer 1187 may be a RAM buffer. Data storage approach 1100 stores the set of unique parities, the set of erasure coded parities, or the encoded message, in the parity buffer 1187. Data stored in the parity buffer 1187 may be written to the parity disks 286. By storing the set of unique parities, the set of erasure coded parities, or the encoded message, in the parity buffer 1187, data storage approach 1100 reduces the number of I/O requests to the parity disks 286. The size of parity buffer 1187 or unique data buffer 1184 may be adjusted based on a set of operating parameters associated with the data storage system 280, a property of the systematic erasure outer precode 230, or a property of the systematic erasure inner precode 270, or a property of the systematic UEP rateless LT code.

Example methods and apparatus improve on conventional approaches in at least the following measurable ways. Example methods and apparatus reduce the memory footprint of conventional approaches by using weaker hashing. In one embodiment, example methods and apparatus access a set of chunked data and apply systematic erasure precoding to the set of chunked data before de-duplicating the set of chunked data. By applying systematic erasure precoding before deduplication, example methods and apparatus facilitate the use of weaker, shorter length hashes for identifying chunks of data. By reducing the hash length, example methods and apparatus reduce the memory requirements of the chunk ID table, reduce the complexity of searching the chunk ID table, and reduce the bandwidth needed to access the chunk ID table, and thereby facilitate a more optimal management of the chunk look-up disk bottleneck problem.

Different types of erasure coding and data deduplication may combine in different ways. Systematic erasure codes do not incur a decode penalty when reading back data that has not encountered any erasures (e.g., no data has been corrupted or lost) since some of the encoded symbols are actually just the plaintext symbols from the original message. When no data has been lost, decoding can be avoided, which helps throughput. Rateless erasure codes handle large data objects well, are flexible for adapting to different levels of protection, and are reliable against random, distributed errors. Thus, example apparatus and methods may employ systematic erasure codes, rateless erasure codes, or even systematic rateless erasure codes. Other forms of erasure codes may also be employed.

Variable-length, block-level data deduplication exhibits superior performance in some deduplication applications. For example, variable-length, block-level data deduplication quickly adapts to a data stream and synchronizes to data segments that have occurred elsewhere regardless of whether data has been inserted or removed. Variable-length, block-level data deduplication can be performed 'in-line' where all data does not need to be seen first or may be performed in post-processing. While variable-length, in-line, block-level deduplication is described, other types of deduplication may be combined with various forms of erasure coding.

Example methods and apparatus also facilitate providing unequal error protection (UEP) to stored data. Example methods and apparatus may adjust encoding parameters to provide different levels of error protection to different unique blocks of data or groups of blocks. Adjustable parameters may include the size of a file block to be encoded, a number of data segments to be encoded, a number of parity segments to generate, a storage strip size used by the data storage system, a packet size used by the data storage system, an internal buffer size of a data storage device, or a memory subsystem in the data storage system. In one example, if Reed-Solomon (RS) codes are being used, the parameters of the RS code, including a number of message symbols, a symbol size and a number of redundant blocks to be generated, can be adjusted so as to meet a data durability goal. Fountain code parameters may also be adjusted. Some parameters that may be automatically dynamically adjusted include message size, block length, coding overhead, interleaving overhead, a buffer size, or a packet size used by the data storage system. For example, uniformly random segment losses due to network or hardware failures may be compensated for by introducing more redundancy into the system. However, adding more redundancy can lead to space-inefficient operation. The latter is referred to as the interleaving overhead of the system.

Some embodiments of example methods and apparatus use probabilistic erasure codes for encoding and decoding data. Fountain codes are an example of a probabilistic erasure code.

Example methods and apparatus may adaptively employ online coding. Online coding is a type of Fountain coding. Conventional data storage approaches may employ Fountain codes for multimedia streaming and large scale data storage. The performance of Fountain codes is measured using averaging arguments. Fountain code performance may also be described by an ensemble average due to the probabilistic nature of Fountain codes. Fountain code performance hinges on the degree and edge selection distributions induced on their graphical representations. Linear Fountain codes described herein use an LT base encoding stage code with fixed-rate, multiple erasure coding stages on top (e.g. precoding). For example, some online codes use a single precoding stage followed by an LT coding stage with a particular degree selection distribution and rate such that the recovery of the message block is ensured with high probability. Example methods and apparatus employ an outer precoding stage and an inner precoding stage, followed by the LT coding stage. In some embodiment, more than two precoding stages may be used.

By performing an outer precoding stage before deduplication, example methods and apparatus reduce the impact of hash collisions on the deduplication process, reduce the computational complexity of internal algorithms such as binary searching, and reduce the amount of RAM needed by the chunk ID table, by facilitating the use of weaker hash functions that require less RAM than strong hash functions. By allowing controlled collisions, example methods and apparatus improve data deduplication performance and facilitate more efficient use of storage space. By performing deduplication before erasure coding, only unique data is encoded, which reduces the time required to perform erasure coding. By performing erasure coding after deduplication, unique chunks are protected by some redundancy, which facilitates mitigating the risk of removing redundant data. Protecting unique chunks using erasure coding may have the technical effect of allowing the use of less expensive (e.g., RAID-5, near line storage) storage systems instead of more expensive (e.g., RAID-6, enterprise storage) storage systems.

Example methods and apparatus provide unequal error protection (UEP) to stored data. In one embodiment, using a rateless erasure code approach facilitates selectively and adaptively varying the level of data protection (e.g., erasure code approach) for different pieces of unique data. In one embodiment, the value of the unique data may be measured by the number of references to the unique data, or the size of the unique data. For example, a segment of shared data that is present in several files may have more references to it and thus may be treated as being more valuable than a segment of shared data that is used in fewer files and thus has fewer references. While reference counts are described, other value measures may be employed (e.g., the number of bytes in the original file or unique data). Thus, the number of erasure code symbols that are produced, the characteristics (e.g., size, composition) of the erasure code symbols that are produced, the distribution of the erasure code symbols that are produced, the type of erasure encoding (e.g., rateless, systematic), or other erasure code attributes may be manipulated based on an attribute (e.g., importance, size, number) of the unique chunks. Since the attribute (e.g., importance, size, age) of the unique chunks may vary over time, in one embodiment, the number of erasure code symbols used to protect a unique chunk may be updated upon determining that the attribute has changed. For example, as reference counts to a chunk increase, the number of erasure code symbols used to protect the chunk may be increased.

Although a distributed storage system is described herein, example apparatus and methods may also be employed with a communication system. For example, metadata that tracks unique segments may be maintained at both a sender and a receiver. The metadata may be maintained for different periods of time to accommodate different history durations. Unique segments and the metadata (e.g., recipes) associated with recreating larger data objects (e.g., files) from the unique segments may be encoded by a transmitter and provided to a receiver. In one embodiment, the recipes may be encoded and provided, which prompts a receiver to identify segments that are desired, which in turn prompts encoding and providing the erasure code symbols for the desired segments.

The detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, calculating, determining, and so on, refer to actions and processes of a computer system, logic, processor, or similar electronic device that manipulates and transforms data represented as physical (electronic) quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 4:
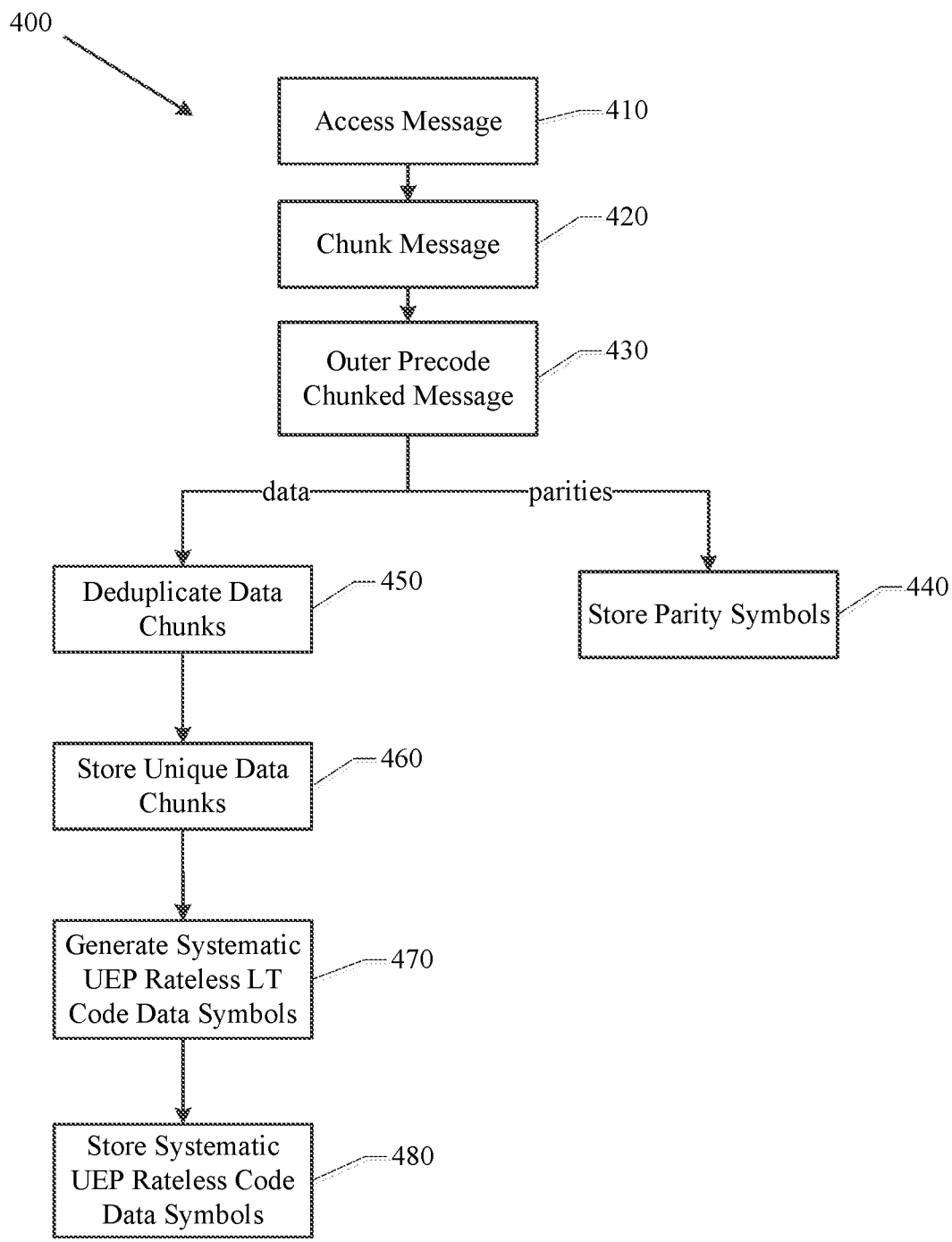
FIG. 4 illustrates an example method for jointly de-duplicating and erasure coding a message in a distributed storage system.

FIG. 4 illustrates a computerized method 400 for deduplicating and erasure coding a message. Method 400 includes, at 410, accessing a message. The message has a message size. The message may be a file, a chunk of data, a block of data, an object, or other data structure. Accessing the message may include accessing the message directly from a data storage apparatus, or indirectly via an electronic database, a memory, a network, or other electronic communication channel.

Method 400 also includes, at 420, generating a set of message chunks by chunking the message using a first chunking approach. In one embodiment, the first chunking approach is a sliding window technique. The first chunking approach may use weak hashing to identify chunk boundaries. The weak hashing may include Rabin fingerprinting with random polynomials. In other embodiments, other types of hashing may be used to generate the set of message chunks.

Method 400 also includes, at 430, generating a set of outer-precoded parity symbols and a set of outer-precoded data symbols from the set of message chunks using an outer precode. In one embodiment, the set of outer-precoded parity symbols includes a subset of outer-precoded parity symbols that is distinct from the set of outer-precoded data symbols.

In one embodiment, the outer precode is a low density parity check (LDPC) precode. The LDPC precode may be a regular LDPC precode. The LDPC precode is characterized by an LDPC parity check matrix. A regular LDPC parity check matrix is characterized by a column weight $w_c$ and a row weight $w_r$. In one embodiment, the column weight $w_c$ is three, and the row weight $w_r$ is forty-seven. In one embodiment, the column weight and the row weight are fixed. In another embodiment, the column weight and the row weight are not fixed.

Asymptotic erasure correction performance of the LDPC code is characterized by a decoding threshold $\varepsilon^*_0$. The decoding threshold $\varepsilon^*_0$ is a term that represents an erasure symbol probability below which the decoding is guaranteed to succeed. The decoding threshold of a regular LDPC code can be expressed in a closed form as $$\varepsilon_0^* = \inf\left\{\frac{x}{(1-(1-x)w_r-1)w_c-1}, \forall x, x \in (0, 1)\right\}.$$

In one embodiment, the column weight $w_c$ is three, and the row weight $w_r$ is forty-seven, which results in a block length of 11086. In one embodiment using a 16-bit CRC where the CRC length l=16 and n≈3000, where n represents the number of unique chunks to be encoded, example methods and apparatus facilitate achieving a symbol failure probability of approximately 0.021, which results in a decoding threshold $\varepsilon^*_0$ of approximately 0.05265, which is greater than the failure probability of 0.021. In a situation in which symbol anomalies are a mixture of errors and erasures, and where the error rate is lower than the erasure rate, the margin between the symbol failure probability of approximately 0.021 and the decoding threshold $\varepsilon^*_0$ of approximately 0.05265 facilitates the use of efficient decoding algorithms for LDPC codes by example methods and apparatus. One suitable efficient decoding algorithm is described in G. Liva et al., "A decoding algorithm for LDPC codes over erasure channels with sporadic errors," in *Proc. 48th Allerton Conf.*

*Commun., Control, and Computing,* Monticello, Ill., USA, September 2010, pp. 458-465. Other efficient decoding algorithms may be employed.

Method 400 also includes, at 440, storing the set of outer-precoded parity symbols in a data storage system. The data storage system may include one or more data storage devices. In one embodiment, the one or more data storage devices may include a tape drive, a hard disk drive (HDD), a solid state drive (SSD), a hybrid solid state drive (HSSD), or a shingled magnetic recording (SMR) device. In another embodiment, other types or configurations of data storage devices may be employed. The data storage system may be a distributed data storage system, including a cloud storage system. By computing, generating, and storing the set of outer-precoded parity symbols, example methods and apparatus reduce the loss of data due to collisions caused by the use of a weaker hash function.

Method 400 also includes, at 450, generating a set of unique data symbols by deduplicating the set of outer-precoded data symbols based, at least in part, on a chunk identification (ID) table. The chunk ID table stores a unique chunk ID associated with a unique data symbol stored in the data storage system, a chunk size associated with the unique data symbol, or a chunk reference count associated with the unique chunk ID. The chunk ID table may be stored in RAM. In one embodiment, the unique chunk ID is generated using a weak hash function.

An ideal hash function distributes all possible sets of IDs with uniform randomness over all unique chunks. With a data storage system or data protection policy that can tolerate a set of hash collision probabilities $p_{col} = \{10^{-6}, 10^{-16}, 10^{-26}, 10^{-36}\}$ or less, and that uses an ideal hash function with varying degrees of size in bits, the upper bound on the number of unique chunks that can be stored without violating the specified collision probability may be calculated. Thus, to guarantee a lower hash collision probability (e.g. $p_{col} = \{10^{-36}\}$) for indexing unique data chunks, longer hash values need to be calculated using stronger hash functions. Conventional approaches may use a strong hash function such as SHA-1 to maintain the required low hash collision probability in the index for a data storage system dealing with, for example, approximately 1.6 million unique chunks. Example methods and apparatus improve on conventional approaches by using a weak hash function for both chunking and hashing. By requiring, in one embodiment, a hash collision probability of $10^{-6}$ for indexing unique chunk IDs, example methods and apparatus facilitate using approximately 60 bits for a hash ID, and result in at least a 60% RAM space saving in the chunk ID table compared to conventional approaches. By applying an outer precode before performing deduplication, example methods and apparatus can achieve a reliability equivalent to or better than that achieved by a $10^{-36}$ collision probability of the SHA-1 based approach, but with reduced RAM usage. Example methods and apparatus thus improve the performance and function of a data storage system in a tangible, measurable way.

Method 400 also includes, at 460, storing a copy of the set of unique data symbols in the data storage system. Method 400 may also store metadata associated with the unique data symbols in the data storage system. In one embodiment, metadata associated with the unique data symbols includes a chunk size associated with a unique data symbol, a reference count associated with the unique data symbol, or other information associated with the unique data symbol. Metadata associated with the unique data symbols or other data stored in the data storage system may also include a creation time, a modification time, an ownership indicator, a data format type indicator, or other metadata. Metadata associated with the unique data symbols may also be stored in the chunk ID table. In another embodiment, other metadata may be stored in the data storage system, as extended attributes, or inside the chunk ID table. Metadata may be stored in different locations as a function of a file system in which example methods and apparatus operate. In one embodiment, storing a copy of the set of unique data symbols in the data storage system includes storing the set of unique data symbols in a buffer. The set of unique data symbols may be stored in a RAM buffer before they are stored to disk or other, slower data storage devices.

Method 400 also includes, at 470, generating a set of inner-precoded data symbols from the set of unique data symbols using an inner-precode. In one embodiment, the inner precode generates a set of inner-precoded data symbols comprising k' intermediate symbols from the set of unique data symbols, where the set of unique data symbols comprises k unique data symbols, where k and k' are integers, k' being greater than k. In one embodiment, the inner precode is a systematic high rate RS code, or a systematic high rate LDPC code configured for sporadic errors. Sporadic errors are associated with sporadic channels. Sporadic channels are one type of channel that includes a mixture of binary error and erasure channels with an error probability that is significantly smaller than the erasure probability. In some instances, the error probability is at least an order of magnitude smaller than the erasure probability. A systematic high rate LDPC code configured for sporadic errors is described in G. Liva et al., "A decoding algorithm for LDPC codes over erasure channels with sporadic errors," in *Proc. 48$^{th}$ Allerton Conf. Commun., Control, and Computing,* Monticello, Ill., USA, September 2010, pp. 458-465. In another embodiment, the inner precode may be another type of systematic code.

Figure 7:
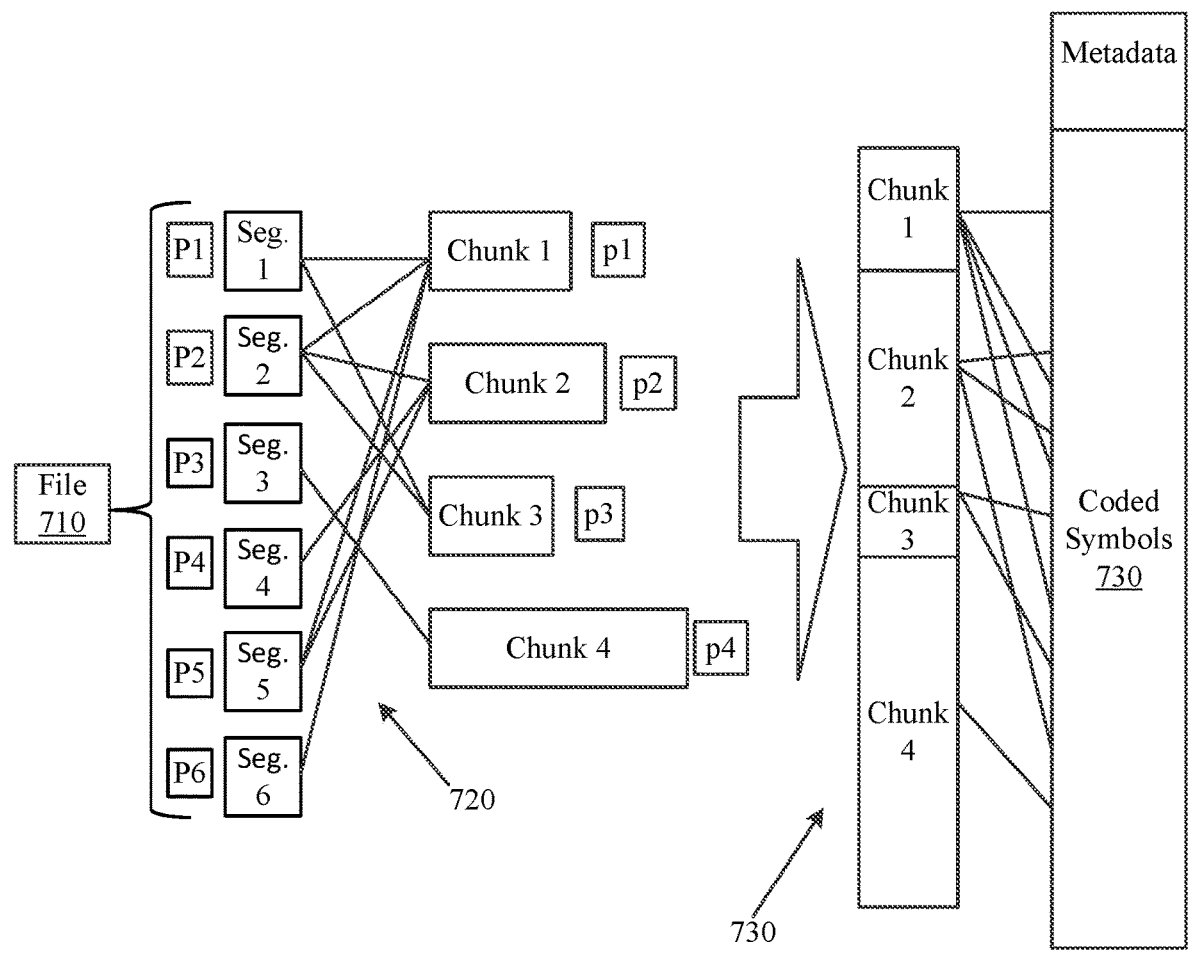
FIG. 7 illustrates an example of de-duplicated chunks concatenated and encoded by a base encoder.

In one embodiment, method 400 concatenates a subset of the inner-precoded data symbols to generate a concatenated subset of inner-precoded data symbols. The size of the subset of inner-precoded data symbols may be based, at least in part, on a data protection policy. FIG. 7 illustrates a subset of inner-precoded data symbols concatenated to form a concatenated subset of inner-precoded symbols 730.

Method 400 also includes, at 470, generating a first set of erasure codes from the set of inner-precoded data symbols or the concatenated subset of inner-precoded data symbols using an unequal error protection (UEP) rateless LT code. Method 400 generates the first set of erasure codes based, at least in part, on the chunk ID table.

FIG. 7 illustrates one approach to UEP coding suitable for use by example methods and apparatus. FIG. 7 illustrates a message 710 that has been chunked into segments seg.1 . . . seg.6. Message 710 may be, for instance, a file. The segments seg.1 . . . seg.6 are provided to a deduplication apparatus or method that produces four unique chunks, chunk1 . . . chunk4. There may be different numbers of reference counts to the different unique chunks. The chunks may have different chunk-level access probabilities $\{p_1, p_2 \ldots p_4\}$. The segments may have the same or different user-defined attributes (e.g., value metrics, size).

FIG. 7 further illustrates that the segments seg.1 . . . seg.6 may be inaccessible or failed with probabilities $\{P_1, P_2 \ldots P_6\}$. After deduplication, a reconstruction quality profile for a segment may be changed based, for example, on reference counts or other metadata. The reference counts are illustrated using a bipartite graph in which the graph connections 720 establish which segment contains which chunk in a storage pool of chunks. The set of probabilities $\{P_1, P_2 \ldots P_6\}$ may induce different chunk-level access probabilities $\{p_1, p_2 \ldots p_4\}$. In one embodiment, chunk-level probabilities may then be constrained to satisfy an example set of inequalities:

$$1-(1-p_1)(1-p_3) <= P_1$$

$$1-(1-p_1)(1-p_2)(1-D_3) <= P_2$$

...

Note that even if $P_i$ are the same, the $p_i$ can still be different. Based on $\{P_1, P_2 \ldots P_6\}$ and the set of inequalities, chunk level recovery can be guaranteed by calculating the appropriate set $\{p_1, p_2 \ldots p_4\}$. An erasure coding mechanism can be manipulated by changing or adjusting parameters of the erasure coding approach to protect these chunks at a level appropriate to the chunk-level probability requirements. Different erasure coding approaches can be applied to different chunks having different chunk-level probability requirements. For example, chunk1 has more connections (e.g., 4) than any other chunk in the pool. In an example parity based systematic EC approach, more parity may be allocated for chunk1 in the erasure coding phase. The amount of parity allocated for chunk1 may be larger than the amount of parity allocated for chunk2, the amount of parity allocated for chunk3, or the amount of parity allocated for chunk4. In another example, the most important chunk may be protected by making all of the parities protect it using, for example, 60% of their protection capability. The amount of parity allocated for a chunk may be proportional to an attribute (e.g., number of connections, size) of the chunk. More generally, variable size chunks having varying sensitivity to loss may be protected using different numbers of parity symbols in a systematic erasure code approach. Even more generally, chunks having different attributes may be protected differently by controlling attributes of an erasure coding approach. The attributes of an erasure coding approach (e.g., number of parity symbols employed) may vary over time as the attributes of the chunks (e.g., number of connections) vary over time. Thus, example methods and apparatus provide adaptive unequal error protection (UEP) to stored data.

FIG. 7 further illustrates the segments seg.1 ... seg.6 and the unique chunks chunk1 ... chunk4. In one example that uses rateless codes, example apparatus and methods may keep the rateless codeword length above a certain threshold by grouping the unique chunks before erasure coding. Recall that rateless codes incur less overhead penalty with larger block lengths and only have linear time complexity operation. Thus, in one embodiment, deduplicated chunks chunk1 ... chunk4 may be grouped together (e.g., concatenated) to produce a single data item (e.g. concatenated subset of inner-precoded symbols 730) to be erasure encoded. In one embodiment, example methods and apparatus may use a rateless erasure code process. In one embodiment, when deduplicated data exceeds a threshold size, example apparatus and methods may use code words that are larger than a threshold size to facilitate accounting for random failures and thus improve performance of the storage system.

Example methods and apparatus encode the grouped or concatenated chunks to generate a desired number of EC symbols. Example methods and apparatus build the concatenated subset of inner-precoded symbols 730 from the group as processed in light of a generator matrix. To meet desired protection guarantees (e.g., probabilities $\{p_1, p_2, \ldots, p_4\}$) a rateless encoder algorithm applied by example methods and apparatus may be controlled. In one embodiment, a graph defining the properties of the rateless code would make more connections with the higher valued content in the concatenation to increase recoverability of that higher valued content. In one embodiment, node/edge probability distributions realized as non-zero entries in the generator matrix representation of an encoding graph may be manipulated to allow error probabilities less than or equal to $\{p_1, p_2 \ldots p_4\}$. More generally, attributes of erasure codes produced by example methods and apparatus may be controlled by manipulating the generator matrix employed by the example methods and apparatus. For example, the composition of an erasure code (e.g., number of connections between a portion of the message and an erasure codeword) can be controlled by the construction of the generator matrix, which can be manipulated by attributes (e.g., desired probabilities p1 ... p4) of unique chunks.

Method 400 also includes, at 480, storing the first set of erasure codes in the data storage system. Method 400 may also include an additional step of decoding the first set of erasure codes. Decoding the first set of erasure codes may include controlling an RS code decoder, a Fountain code decoder, or a hybrid decoder, to decode the first set of erasure codes. In one embodiment, storing the first set of erasure codes in the data storage system includes storing the first set of erasure codes in a buffer.

Figure 5:
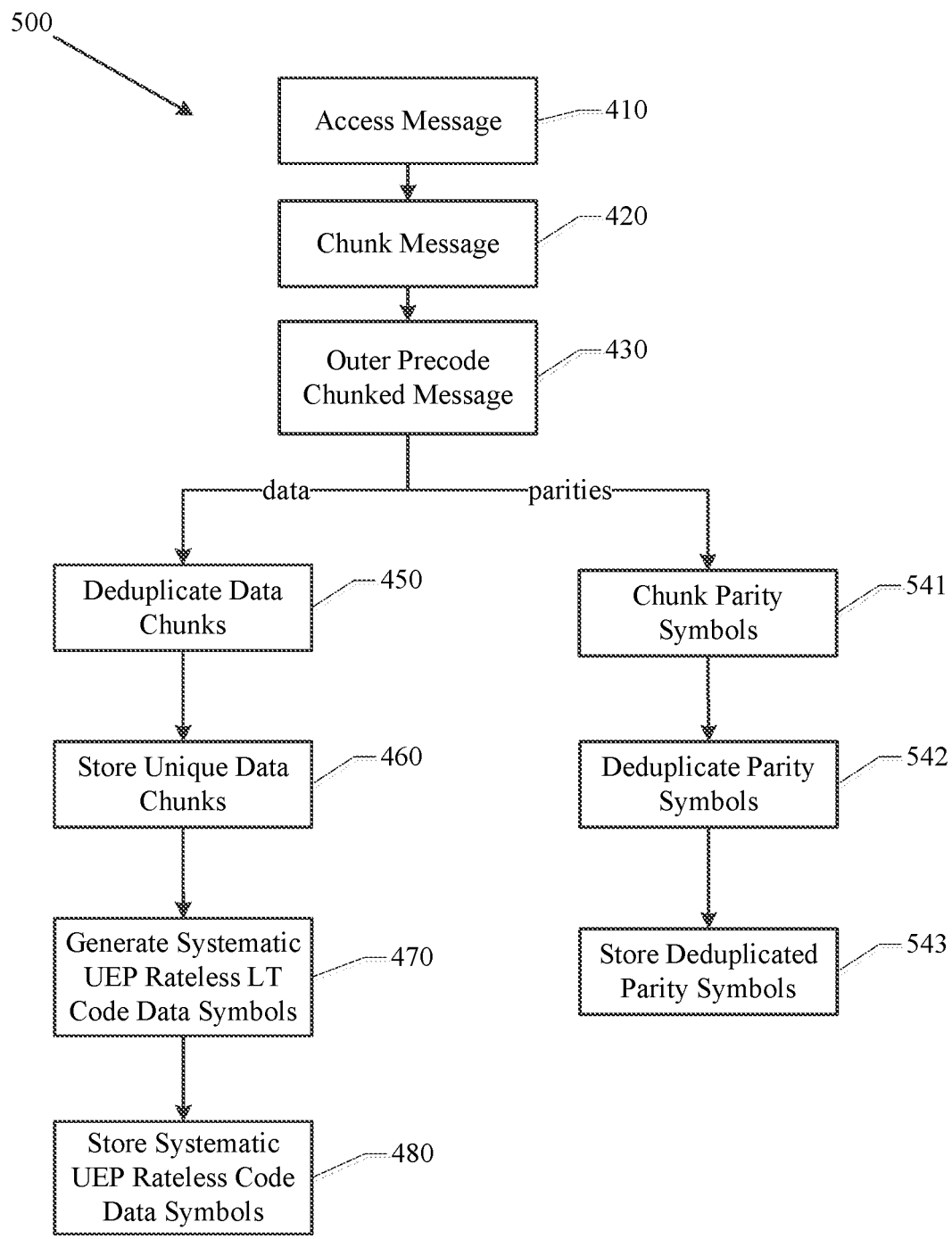
FIG. 5 illustrates an example method for jointly de-duplicating and erasure coding in a distributed storage system.

FIG. 5 illustrates an example method 500 for deduplicating and erasure coding a message. Method 500 is similar to method 400 but includes additional actions. In one embodiment, method 500 includes, at 541, generating a set of chunked outer-precoded parity symbols by chunking the set of outer-precoded parity symbols using a second chunking approach. The second chunking approach may be the same chunking approach as the first chunking approach, or it may be a different chunking approach, or it may be the first chunking approach with different parameters. The second chunking approach may use a weak hash function or smaller average chunk size.

Method 500 also includes, at 542, generating a set of unique parity symbols by deduplicating the set of chunked outer-precoded parity symbols. In one embodiment, the set of unique parity symbols is stored in a different data storage device or database than the set of unique data symbols. Storing the set of unique parity symbols and unique data symbols in different data storage devices facilitates increasing I/O and throughput performance compared to conventional approaches. Method 500 deduplicates the set of chunked outer-precoded parity symbols based, at least in part, on the chunk ID table. Method 500 may deduplicate the set of chunked outer-precoded parity symbols using a weak hash.

Method 500 further includes, at 543, storing the set of unique parity symbols in the data storage system. By deduplicating the set of outer-precoded parity symbols, example methods and apparatus further improve the performance of a data storage system compared to conventional approaches by reducing the amount of storage space needed to store the parity symbols. Method 500 may, at 543, store the set of unique parity symbols in a data storage device dedicated to storing parity symbols. In one embodiment, storing the set of unique parity symbols in the data storage system includes storing the set of unique parity symbols in a buffer. The set of unique parity symbols may be stored in a RAM buffer before they are stored to disk or other, slower data storage devices.

Figure 6:
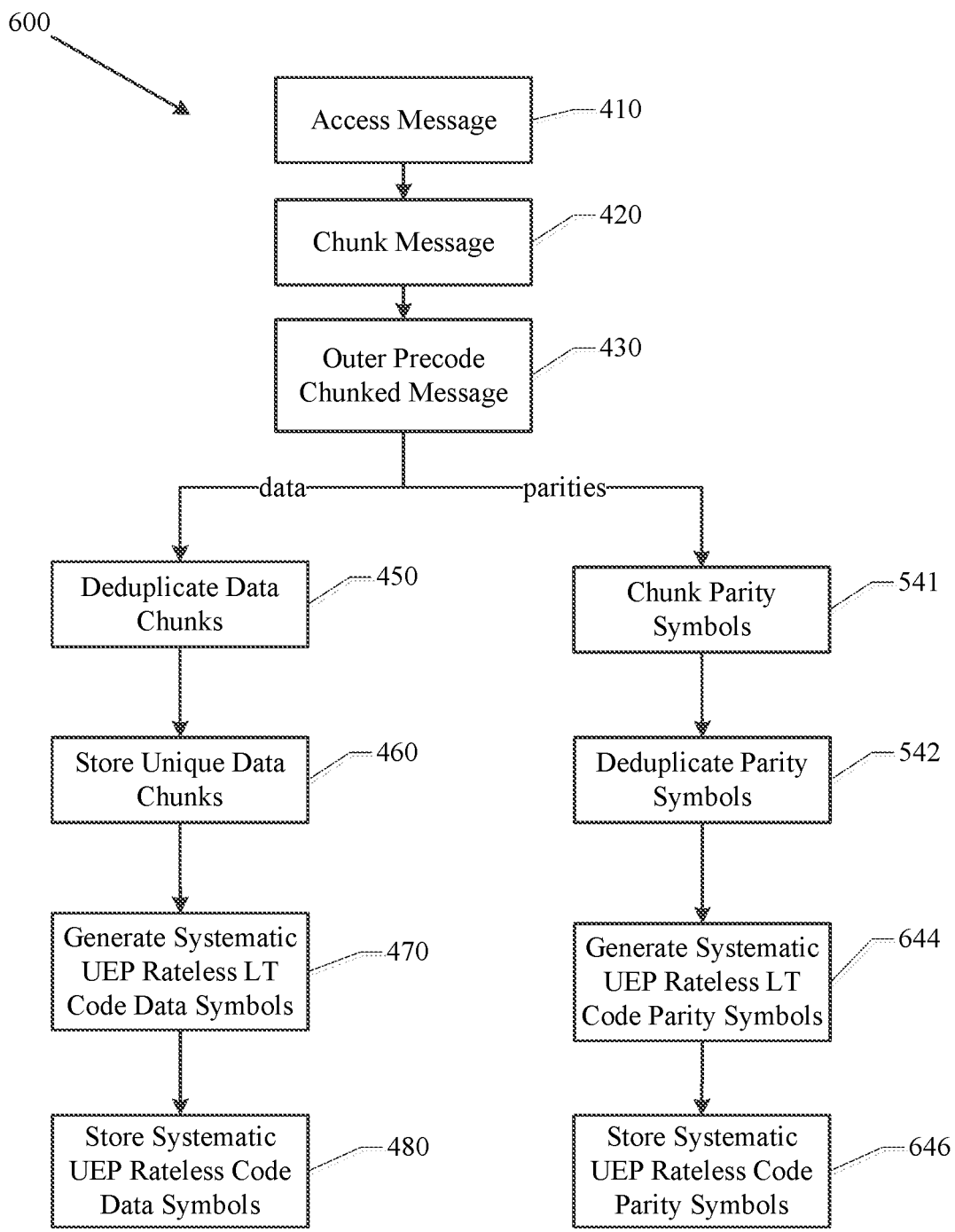
FIG. 6 illustrates an example method for jointly de-duplicating and erasure coding in a distributed storage system.

FIG. 6 illustrates an example method 600 for deduplicating and erasure coding a message. Method 600 is similar to method 400 and method 500, but includes additional actions. In one embodiment, instead of or in addition to storing the set of unique parity symbols in the data storage system, method 600 includes, at 644, generating a second set of erasure codes from the set of unique parity symbols. In one embodiment, method 600 generates the second set of erasure codes using the UEP LT code based, at least in part, on the chunk ID table.

Method 600 further includes, at 646, storing the second set of erasure codes in the data storage system. By erasure encoding the set of unique parity symbols and storing the second set of erasure codes, example methods and apparatus improve on conventional approaches by facilitating a greater level of protection to the set of unique parities than that provided by systems that do not erasure encode parity symbols. In one embodiment, method 600 stores, at 646, the second set of erasure codes in a data storage device dedicated to storing parity symbols or erasure codes. In one embodiment, storing the second set of erasure codes in the data storage system includes storing the second set of erasure codes in a RAM buffer. The second set of erasure codes may be stored in a RAM buffer before they are stored to disk or other, slower data storage devices.

By storing the set of unique data symbols, the first set of erasure codes, the set of unique parity symbols, or the second set of erasure codes in a buffer, example methods and apparatus facilitate reducing the amount of read/write requests to data storage disks or parity disks, while increasing the speed with which erasure precoding may be conducted. Example methods and apparatus thus avoid having to access the data storage disks or parity disks when first storing data, and then again when precoding the data.

While FIG. 4, FIG. 5, and FIG. 6 illustrate various actions occurring in serial, it is to be appreciated that various actions illustrated in FIG. 4, FIG. 5, and FIG. 6 could occur substantially in parallel. By way of illustration, a first process could access a message, a second process could deduplicate the set of outer-precoded data symbols, and a third process could generate an encoded message. While three processes are described, it is to be appreciated that a greater or lesser number of processes could be employed and that lightweight processes, regular processes, threads, and other approaches could be employed. In one embodiment, a first process, a second process, and a third process may be implemented in a pipeline structure without stalls, except for during a situation in which an accessed message, at 410 exhibits a dependency. For example, deduplication, rateless coding, and input/output (I/O) may be handled by different physical or virtual processing unites.

In one embodiment, method 400, method 500, or method 600 may include selectively adapting the LDPC parity check matrix. Selectively adapting the LDPC parity check matrix facilitates ensuring that the erasure correction capability of the outer precode or the inner precode is powerful enough to recover errors that remain after decoding the base LT code used to generate the encoded message. Example methods and apparatus quantify the rate of errors or erasures to facilitate choosing a protection policy based, at least in part, on coding parameters, including a coding rate.

A hash collision happens when two different chunks share the same ID. A data chunk may have a size or a volume, where the size or volume includes the number of bytes a chunk contains. The size or volume may be stored as part of metadata or computed from stored content. In one embodiment, computing the size or volume from stored content includes computing a threshold number of bytes such that when the contents and the computed threshold number of bytes are hashed, the size of the file is returned. Thus, even if two chunks happen to share the same ID, because of different chunk sizes, ID collisions may be identified on a file system level. However, if both chunks have the same size and the same ID, they may become indistinguishable, which results in a true collision. The outcome of a true collision may be referred to as a symbol error. In contrast, an ID-only collision that causes a symbol loss with a known location is referred to as a symbol erasure. The definition of a symbol error or a symbol erasure may be modified based on a feature set of the chunks used to identify the symbol error or symbol erasure. An estimate of error rates or erasure rates can be computed by averaging the number of collided chunks, divided by the total number of chunks in the system.

A chunking approach may produce n unique chunks of integer size $[T_{min}, T_{max}]$, where C is defined as a random variable that characterizes the size of produced chunks. For example, a chunk may have a size $v_j \in [Tmin, Tmax]$ with a probability $P_r\{C=v_j\}=P_j$ where $j \in \{0, 1, \ldots, \Delta_T\}$ and $\Delta_T = Tmax - Tmin$. The probabilities $P_1$ are a function of the data being chunked, the chunking approach, and the parameters of the chunking approach. A chunk ID may be represented with a number of bits 1, where the lth ID value is assigned to a particular chunk with a probability $H_i$.

Example methods and apparatus may employ a tag assignment process for assigning an ID to a chunk. The tag assignment process may assign the ith ID value to a chunk. A tag set may consist of the elements $\{1, 2, \ldots, D\}$ where a chunk is assigned the ith tag with a probability $p_i$. An indicator function is defined as $1_i=1$ if the tag is never chosen by any of the n unique chunks. The indicator function is defined as $1_i=0$ if the tag is chosen. A random variable A is defined to represent the number of distinct tags in the assignment process. The random variable A may be expressed in terms of $1_i$ as $A = D - \sum_{i=1}^{D} 1_i$, where the sum characterizes the number of distinct tags that were not chosen by any chunks. Thus, $$\mathbb{E}[1_i] = Pr\{1_i=1\} = (1-p_i)^n \qquad \text{(eq. 1)}$$

where $p_i$ equals $H_1$ if IDs constitute the tag set with $D=2^l$, and $\mathbb{E}$ represents the expectation operator. If a chunk has a pair of tags (e.g. a pair of features) including one tag for the chunk ID and one tag for the size of the chunk, instead of just one tag, and if the tag selection process is independent, then $p_i = P_i H_i$ and $D = (\Delta_T+1)2^l$. In one embodiment, this tag assignment process may be extended for a more than two tags case.

Example methods and apparatus may define a random variable Z to represent the number of collided chunks, expressed as $Z = n - A$. With an ideal hash function that distributes all possible sets of IDs uniformly randomly over all the unique n chunks, for example $H_i = 2^{-l}$, then the expected value of Z may be expressed as:

$$\mathbb{E}[Z] = n - \mathbb{E}[A] = n - D + \sum_{i=1}^{D} \mathbb{E}[1_i] =$$

$$n - (\Delta_T+1)2^l + \sum_{i=1}^{2^l} \sum_{j=1}^{\Delta_T+1} \left(1 - \frac{P_j}{2^l}\right)^n \approx \qquad \text{(eq. 2)}$$

-continued $$n - 2^l \left( \Delta_T + 1 - \sum_{j=1}^{\Delta_T+1} e^{-P_j n 2^{-l}} \right) \quad \text{(eq. 3)}$$

where $l \gg \log_2\left(\frac{n}{\Delta_T + 1}\right)$.

Thus, $\mathbb{E}[Z]$ is a function of the number of tags D, and the probability of assigning the tags to the chunks $\{p_i\}_{i=1}^n$. Including the number of tags D, and the probability of assigning the tags to the chunks $\{p_i\}_{i=1}^n$ as arguments, where $\mathcal{C}$ is the evaluation of $\mathbb{E}[Z]$ using parameters D and $p_i$, let $$\mathcal{C}_{\mathbb{E}[Z]}(D, p_i) = n - D + \Sigma_{i=1}^D (1 - p_i)^n. \quad \text{(eq. 4)}$$

Here, $\mathcal{C}_{\mathbb{E}[Z]}(2^l, H_i)$ characterizes the sum of errors and erasures, since there may be chunks whose IDs are the same and yet may or may not contain the same volume of data (e.g. have different sizes). However, $\mathcal{C}_{\mathbb{E}[Z]}((\Delta_T+1)2^l, P_i H_i)$, which is approximated by equation 3, characterizes only the errors, because in this case for a collision to happen the chunks must both have the same size and IDs. Thus, with respect to the erasure only expected collisions:

$$\mathcal{C}_{\mathbb{E}[Z]}(2^l, H_i) - \mathcal{C}_{\mathbb{E}[Z]}((\Delta_T+1)2^l, P_i H_i) \approx 2^l (\Delta_T + e^{-n2^{-l}} - \Sigma_{j=1, i=1}^{\Delta_T+1} e^{-P_j n 2^{-l}}) \quad \text{(eq. 5)}$$

Example methods and apparatus adjust UEP parameters and LDPC matrix construction based on the number of erred and erased symbols, and not just chunks, caused by the weak hash function. Example methods and apparatus compute a worst case (WC) symbol error/erasure probability by determining the largest number of erred or erased symbols in a case of a chunk ID collision. In one embodiment, $\mu_c < T_{min}$ is used as a constant symbol size. The worst case (WC) number of symbol failures may be represented by WC fail symbols, where a WC fail symbol has a range. Worst case symbol failure characterizations for k>r may be characterized explicitly as indicated in table 1:

TABLE 1

| WC fail symbols | Range |
|---|---|
| r | $v_i \in [T_{min}, T_{min} + \tau]$ |
| r + 1 | $v_i \in [T_{min} + \tau + 1, T_{min} + \tau + \mu_c]$ |
| ... | ... |
| k | $v_i \in [T_{min} + \tau + (k - r - 1)\mu_c + 1, T_{min} + \tau + (k - r)\mu_c]$ |
| ... | ... |
| m | $v_i \in [T_{min} + \tau + (m - r - 1)\mu_c + 1, T_{max}]$ |

As characterized in table 1, $$r = \left\lceil \frac{T_{min}}{\mu_c} \right\rceil + 1_{(T_{min} \bmod \mu_c \neq 1)} \text{ and}$$

$$m = \left\lceil \frac{T_{max}}{\mu_c} \right\rceil + 1_{(T_{max} \bmod \mu_c \neq 1)},$$

where $\tau$ is the smallest positive integer such that (T_min+$\tau$) mod $\mu_c$=1. The scenario represented in table 1 considers the situation where failed chunks are isolated from other failed chunks. If failed chunks are adjacent to other failed chunks, the total number of failed symbols may be less than indicated in table 1.

Identically distributed random variables $W_j = W$ characterize the worst case number of failed symbols to be equal to $k \in \{r, r+1, \ldots, m\}$ due to the jth collided chunk with the probability $$Pr\{W = k\} = \sum_{\substack{v_i \in [\max\{T_{min}, T_{min}+\tau+(k-r-1)\mu_c+1\}, \\ \min\{T_{max}, T_{min}+\tau+(k-r)\mu_c\}]}} P_i$$

Since $\tau < \mu_c - 1$, min and max functions may be used to shorten the notation of the probability $Pr\{W=k\}$ expression. In one embodiment, where random variables are independent and the distribution function of C does not change when conditioned on the chunks being erred or erased, the WC average number of failed coding symbols may be computed as $\mathbb{E}[Z]\mathbb{E}[W]$, where the computation of $\mathbb{E}[Z]\mathbb{E}[W]$ is based on an analysis of the sum of a random number of random variables.

In one embodiment, where the random variable C is uniformly distributed and the condition m>>r holds, example methods and apparatus may approximate the distribution of W to be uniform. In the situation where the distribution of W is uniform, $P_j$ will be approximately equal to $$\frac{1}{\mu_c(m - r + 1)}$$

since the probabilities must add up to unity, and $\mathbb{E}[W] \approx (m+r)/2$. Thus, using equation 5, example methods and apparatus may compute the WC average number of symbol erasures in a closed form as:

$$(\mathcal{C}_{\mathbb{E}[Z]}(2^l, H_i) - \mathcal{C}_{\mathbb{E}[Z]}((\Delta_T + 1)2^l, P_i H_i))\mathbb{E}[W] \approx$$

$$2^{l-1}(m + r)\left(\Delta_T + e^{-n2^{-l}} - (\Delta_T + 1)e^{\frac{n2^{-l}}{\mu_c(m-r+1)}}\right)$$

The WC average number of symbol errors may be expressed similarly.

Figure 8:
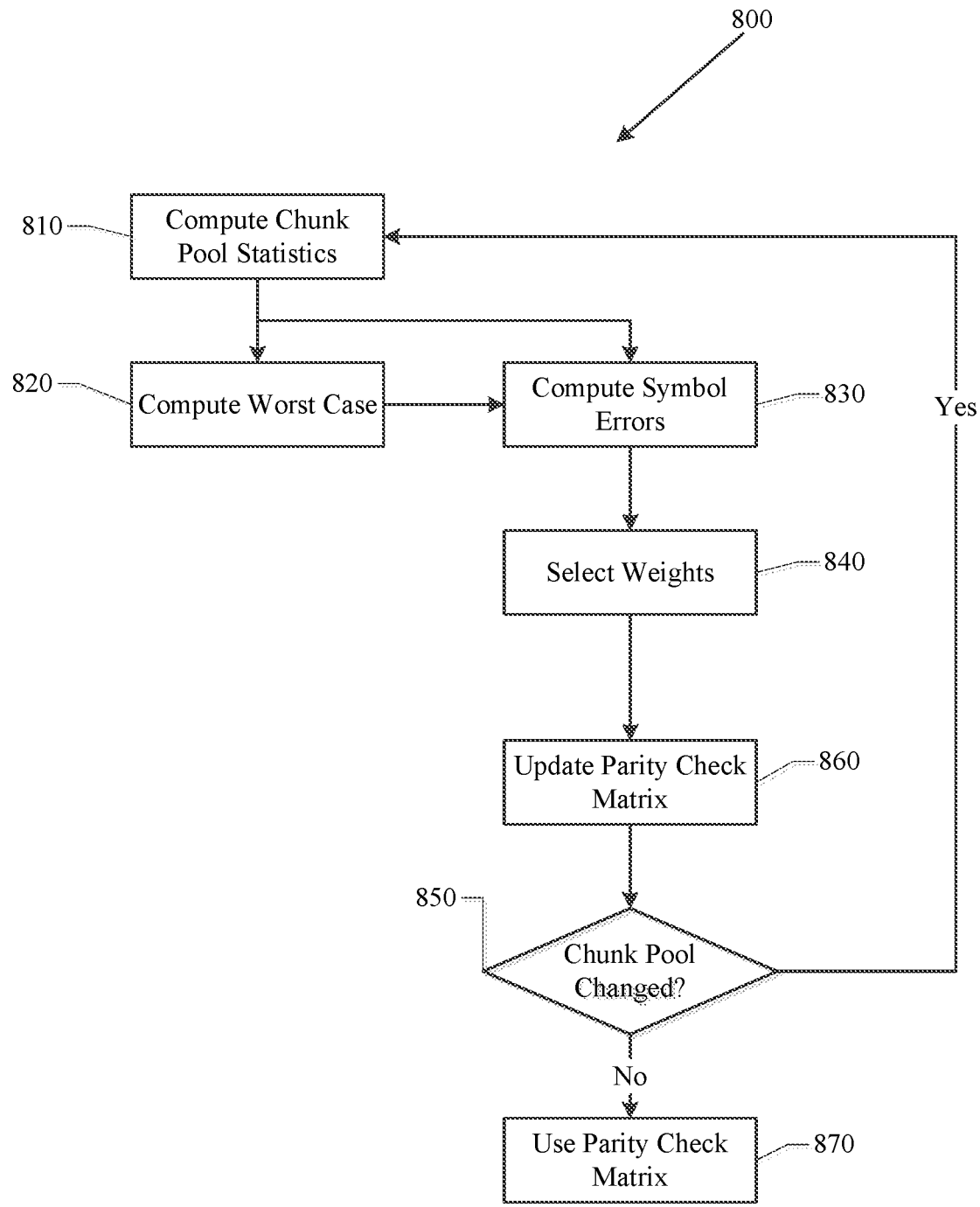
FIG. 8 illustrates an example method for selectively adaptively updating a low density parity check (LDPC) matrix.

FIG. 8 illustrates a method 800 for selectively adapting the LDPC parity check matrix for the outer precode that is suitable for use by embodiments of methods and apparatus described herein. Method 800 includes, at 810, computing a set of chunk statistics associated with the first set of erasure codes. The set of chunk statistics may include a chunk reference count, a frequency of chunk accesses, a frequency of file accesses, a chunk boundary distribution, whether a chunk boundary coincides with a symbol boundary, or a chunk size distribution. In one embodiment, the set of chunk statistics may also include an estimation of the random variables introduced by the WC computation. In another embodiment, the set of chunk statistics may include the amount of different chunks produced as a function of a change below a threshold level occurs in a file, where the amount of different chunks produced is based, at least in part, on a property of the file and the chunking approach used to chunk the file.

Method 800 also includes, at 820, generating a worst-case (WC) symbol characterization for a member of the first set of erasure codes. The WC symbol characterization represents the average WC symbol error or erasure probability. Method 800 also includes, at 830, computing an average number of symbol errors or symbol erasures for the first set of erasure codes. The average number of symbol errors or symbol erasures is based, at least in part, on a set of deduplication parameters, the set of chunk statistics, or the WC symbol characterization.

Method 800 also includes, at 840, choosing a column weight or a row weight for a regular LDPC matrix. Method 800 chooses the column weight $w_c$ or the row weight $w_r$ such that the probability of decoding failure $P_f$ is less than a decoding threshold. In one embodiment, the probability $P_f$ represents the probability of hitting a stopping set while running a belief propagation algorithm on a decoding circuit, in which case the decoding circuit flags the entire codeword as undecoded, even through some of the symbols may have already been decoded correctly. In another embodiment, the probability $P_f$ may refer to the non-inevitability of the generator matrix, so that decoding failure occurs. The decoding threshold may be expressed as EP, where EP represents an erasure symbol probability below which the decoding is guaranteed to succeed.

Method 800 also includes, at 850, generating a regular LDPC parity check matrix. The LDPC parity check matrix is generated as a function of the column weight or the row weight. In one embodiment, an irregular LDPC code may be employed. When an irregular LDPC code is employed, example methods and apparatus may select row weight and column weight distribution parameters at 850. The LDPC parity check matrix may be generated as a function of the row weight and column weight distribution parameters.

Method 800 also includes, at 860, determining if there has been a change in the chunk pool. In one embodiment, the chunk pool includes the data storage system, the set of unique data symbols stored in the data storage system, or the set of parity symbols stored in the data storage system. A change in the chunk pool may include a deletion of a threshold number of unique data symbols, an addition of a threshold number of unique data symbols, a change in an operating parameter of the data storage system, a change in a performance metric of the data storage system of a threshold, a change in the target application of the data storage system, or other change. In one embodiment, method 800 determines if there has been a change in the chunk pool on a daily basis. In another embodiment, method 800 determines if there has been a change in the chunk pool on an hourly basis, or on another, different basis. The frequency with which method 800 determines if there has been a change in the chunk pool may be user controllable. The frequency with which method 800 determines if there has been a change in the chunk pool may also be based on a frequency of detected changes in the chunk pool. For example, after a threshold period of time in which the frequency of detected changes has increased beyond a threshold, example methods and apparatus may increase the frequency with which method 800 determines if there has been a change in the chunk pool.

Upon determining that there has been a change in the chunk pool, method 800 returns to step 810 and restarts. For example, an implementation of a data storage system may be operating using an existing LDPC parity check matrix. Upon detecting a change in the chunk pool, the implementation may return to step 810 and generate a new LDPC matrix based upon the detected changes.

Upon determining that there has not been a change in the chunk pool, method 800 may proceed to provide the LDPC parity check matrix for use by example methods and apparatus. The sparse nature of the LDPC parity check matrix facilitates its storing in a read only memory (ROM), an erasable-programmable ROM (EPROM), an electrically erasable ROM (EEPROM), or RAM, based, at least in part, on how frequently the LDPC parity check matrix changes.

Figure 9:
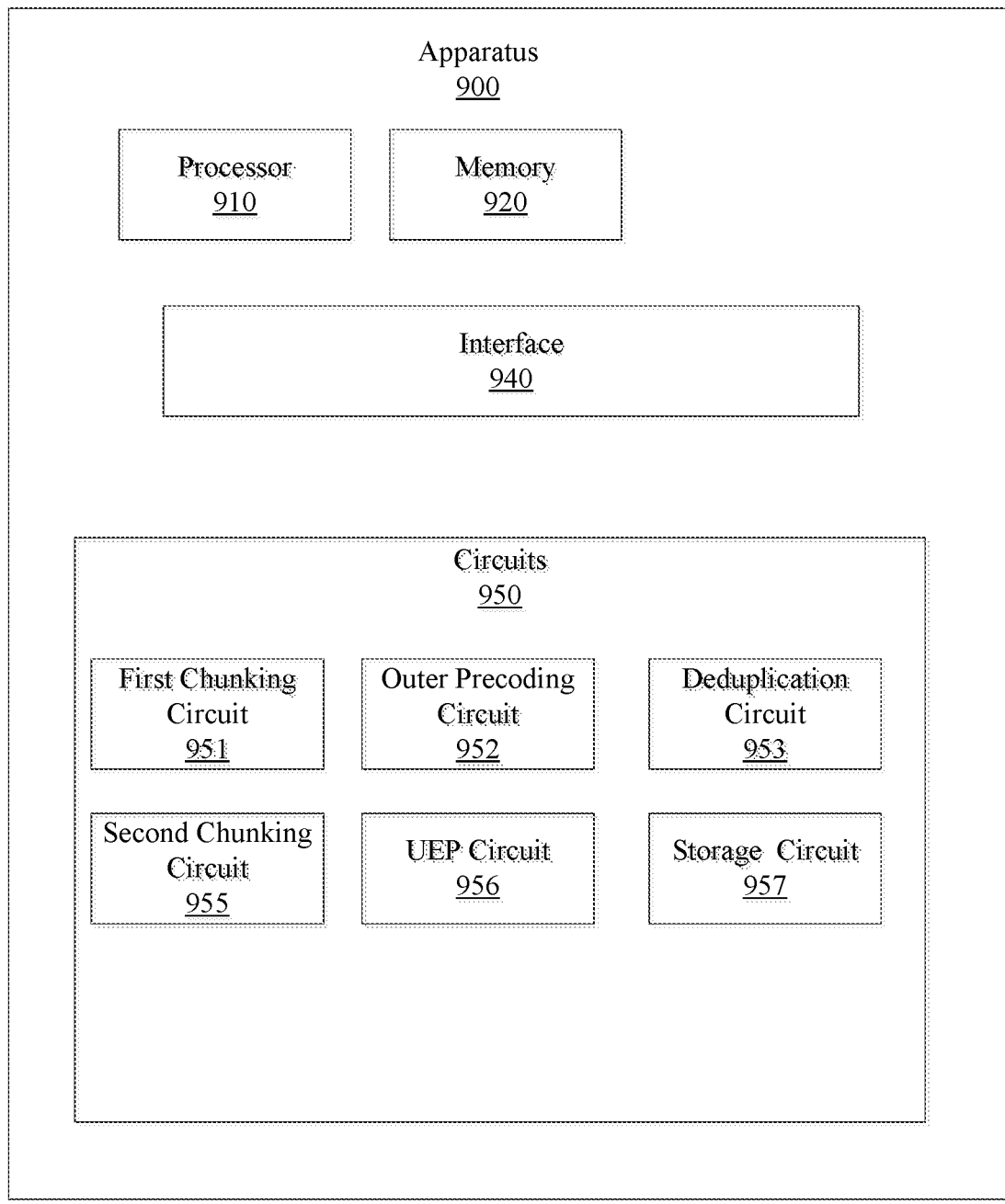
FIG. 9 illustrates an example apparatus for joint de-duplication and erasure coded distributed storage.

FIG. 9 illustrates an example apparatus 900 for deduplicating and erasure coding a message. The message has a message size. The message may be a file, a chunk of data, a block of data, an object, or other data structure. Apparatus 900 includes a processor 910, a memory 920, a set of circuits 950, and an interface 940 that connects the processor 910, the memory 920, and the set of circuits 950. The set of circuits 950 includes a first chunking circuit 951, an outer precoding circuit 952, a deduplication circuit 953, a second chunking circuit 955, an UEP circuit 956, and a storage circuit 957. In one embodiment, the functionality associated with the set of circuits 950 may be performed, at least in part, by hardware circuit components or hardware logic components. The hardware circuit components or hardware logic components may include, but are not limited to, field-programmable gate arrays (FPGAs), application specific integrated circuits (ASICs), application specific standard products (ASSPs), system on a chip systems (SOCs), graphic processing units (GPUs), or complex programmable logic devices (CPLDs). In one embodiment, individual members of the set of circuits 950 are implemented as ASICs or SOCs.

Apparatus 900 may be operably connected to a set of data storage devices. The set of storage devices may include a tape drive, a hard disk drive (HDD), a solid state drive (SSD), a hybrid solid state drive (HSSD), or a shingled magnetic recording (SMR) device. In another embodiment, other types or configurations of data storage devices may be employed. The data storage system may be a distributed data storage system, including a cloud storage service.

Memory 920 stores a chunk identification (ID) table. The chunk ID table stores unique identifiers (e.g. chunk IDs) associated with unique data chunks stored in the data storage system. The chunk ID table may also store metadata associated with a unique data chunk. In one embodiment, the metadata includes a reference count, a coding flag, a seed, a data ID, processing information, or a cyclic redundancy check (CRC). In another embodiment, the metadata may include other, different information.

In one embodiment of apparatus 900, first chunking circuit 951, outer precoding circuit 952, deduplication circuit 953, second chunking circuit 955, UEP circuit 956, or storage circuit 957 are FPGAs, ASICs, ASSPs, SOCs, or CPLDs. In another embodiment, first chunking circuit 951, outer precoding circuit 952, deduplication circuit 953, second chunking circuit 955, UEP circuit 956, and storage circuit 957 may be other types of systems or circuits.

First chunking circuit 951 generates a set of data chunks from the message. In one embodiment, first chunking circuit 951 uses a variable length chunking approach to generate the set of data chunks. In one embodiment, first chunking circuit 951 uses a weak hash based variable length chunking approach or a two-thresholds two-divisors chunking approach to generate the set of data chunks. Two-thresholds two-devisors chunking is described in K. Eshghi et al., "A Framework for Analyzing and Improving Content-Based Chunking Algorithms," HP Labs Technical Report HPL-2005-30R1, http://www.hpl.hp.com/techreports/2005/HPL-2005-30R1.html.

Outer precoding circuit 952 generates a set of precoded data chunks and a set of parity symbols from the set of data chunks. In one embodiment, outer precoding circuit 952 may use a LDPC code or a cyclic redundancy check (CRC) to generate the set of precoded data chunks and the set of parity symbols. In one embodiment, the CRC may be a 16 bit CRC. In one embodiment in which the LDPC outer code uses an LDPC parity check matrix, outer precoding circuit 952 selectively adapts the LDPC parity check matrix. Outer precoding circuit 952 selectively adapts the LDPC parity check matrix as a function of a change in the set of deduplicated data chunks, a change in the set of parity symbols, or a change in the set of erasure codes stored in the data storage system. The LDPC parity check matrix may also be adapted based on changes in chunking parameters, changes in a chunking approach, a hash size, or chunk statistics. In one embodiment, outer precoding circuit 952 selectively adapts the LDPC parity check matrix as a function of a worst case average number of failed coding symbols. The worst case average number of failed coding symbols is based, at least in part, on a worst case average number of symbol erasures, or a worst case average number of symbol errors.

Deduplication circuit 953 generates a set of deduplicated data chunks by deduplicating the set of precoded chunks or the set of chunked parity symbols. Deduplication circuit 953 deduplicates the set of data chunks based, at least in part, on the chunk ID table. In one embodiment, deduplication circuit 953 may use a weak hash deduplication approach. In another embodiment, deduplication circuit 953 may use another, different deduplication approach. For example, deduplication circuit 953 may use a CRC polynomial approach, a 128 bit MD5 approach, or a 160 bit SHA-1 approach.

UEP circuit 956 generates an encoded message from the set of deduplicated data chunks. In one embodiment, UEP circuit 956 generates the encoded message using an inner precode and a Luby transform (LT) base code. A level of erasure protection provided by the UEP circuit 956 is based on a chunk size or a chunk reference count stored in the chunk ID table. In one embodiment, UEP circuit 956 UEP circuit automatically and dynamically adapts the encoding strategy by adjusting the inner precode or the LT base code, a number of deduplicated data chunks to be encoded, a number of coded units generated from the number of deduplicated data chunks, a number of parity units generated from the number of deduplicated data chunks, a word size associated with the encoding technique, a packet size associated with the encoding technique, a symbol size associated with the encoding technique, a buffer size of a member of the set of data storage devices, a decoder failure probability, a coding parameter for an online coding technique, a coding overhead for a Fountain coding technique, a degree distribution for a Fountain coding technique, a precode rate for a Fountain coding technique, a level of hardware acceleration used by the UEP circuit 956, or a level of hardware parallelism used by the UEP circuit 956.

In one embodiment, the level of erasure protection provided by UEP circuit 956 is based on a set of operating parameters. The set of operating parameters includes data storage device failure statistics associated with members of the set of data storage devices, data storage device wear periods associated with members of the set of data storage devices, data storage space constraints associated with members of the set of data storage devices, hardware capabilities available for members of the set of data storage devices, overhead constraints associated with members of the set of data storage devices, data storage device life spans associated with members of the set of data storage devices, a data protection policy, bandwidth constraints, or a property of the message. The set of operating properties may be user adjustable, or may be dynamically adapted by UEP circuit 956.

In one embodiment, UEP circuit 956 generates the encoded message by encoding the message using an encoding strategy. UEP circuit 956 generates an encoded message by encoding the message using an encoding strategy and by associating metadata with the encoded message. In this example, the metadata includes a reference count, a coding flag, a seed, a data ID, processing information, or a CRC. In another embodiment, the metadata may include other, different information.

In one embodiment, storage circuit 957 stores the set of deduplicated data chunks and the encoded message in a distributed storage system. The distributed storage system may include one or more storage devices. The one or more data storage devices include a tape drive, a hard disk drive (HDD), a solid state device, (SSD), a hybrid solid state device (HSSD), or a shingled magnetic recording device (SMR). Storage circuit 957 may distribute the encoded message evenly across storage devices in the distributed storage system, or may distribute the encoded message unevenly. Storage circuit may also store metadata associated with the set of deduplicated data or the encoded message, including a reference count, a coding flag, a seed, a data identifier, processing information, or a cyclic redundancy check (CRC) in the distributed storage system. The set of deduplicated data chunks may be stored in a data storage device dedicated to storing deduplicated data. The encoded message may be stored in a data storage device dedicated to storing erasure codes or parity symbols.

In one embodiment, apparatus 900 may also include a second chunking circuit that generates a set of chunked parity symbols from the set of parity symbols using the variable length chunking approach. In this example, the second chunking circuit uses a weak hash based variable length chunking approach or a two-thresholds two divisors chunking approach. Chunking and deduplicating the set of parity symbols further reduces the storage requirements of apparatus 900 compared to conventional approaches, by reducing the storage space needed to store the parity symbols. In one embodiment, storage circuit 957 further stores the set of deduplicated data chunks in first buffer. Storage circuit 957 may also further store the set of parity symbols or the encoded message in a second, different buffer. The first buffer or the second buffer may be a RAM buffer.

In one embodiment, apparatus 900 may also include a display circuit that displays the current status of the data storage system. The display circuit may control a graphical user interface (GUI) to display the current status of the data storage system. The current status may include the available storage space as a function of the encoding strategy, or the set of operating parameters.

In one embodiment, apparatus 900 may also include a decoding circuit that reconstructs the message based on the set of deduplicated data chunks, the set of parity symbols, or the encoded message. The decoding circuit may include an RS code decoding circuit, a Fountain code decoding circuit, or a hybrid decoding circuit.

While FIG. 9 illustrates an example apparatus 900 that include various components connected in various ways, it is to be appreciated that other apparatus may include other components connected in other ways.

Figure 10:
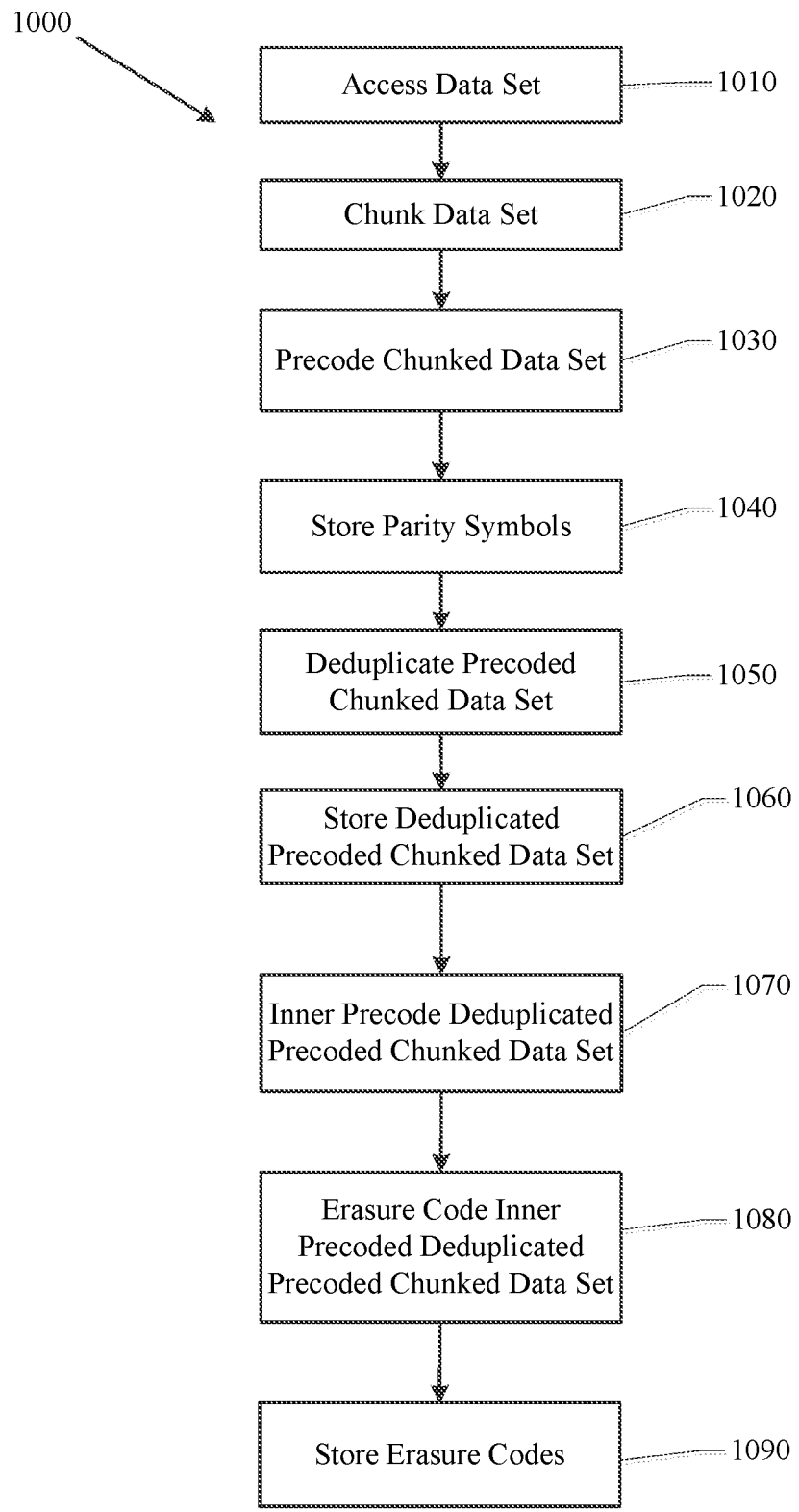
FIG. 10 illustrates an example method for storing data in a cloud storage system.

FIG. 10 illustrates an example method 1000 for storing electronic data in a cloud-based data storage system. Method 1000 includes, at 1010 accessing a data set. The data set has a size. The data set may be a file, a chunk of data, a block of data, an object, or other data structure.

Method 1000 also includes, at 1020 generating a chunked data set by chunking the data set. In one embodiment, method 1000 uses a sliding window technique to chunk the data set. Method 1000 may generate the chunked data set using weak hashing to identify chunk boundaries. The weak hashing may include Rabin fingerprinting with random polynomials. In other embodiments, other types of hashing may be used to generate the chunked data set.

Method 1000 also includes, at 1030, generating an outer precoded chunked data set and a set of parity symbols by precoding the chunked data set. In one embodiment, precoding the chunked data set includes using LDPC precode. The LDPC precode may be a regular LDPC precode. The LDPC precode may use a corresponding LDPC parity check matrix. The LDPC parity check matrix may be selectively adapted.

Method 1000 also includes, at 1040, storing the set of parity symbols in a cloud-based data storage system. The cloud-based data storage system may include a plurality of data storage devices. In one embodiment, the plurality of data storage devices may include a tape drive, a hard disk drive (HDD), a solid state drive (SSD), a hybrid solid state drive (HSSD), or a shingled magnetic recording (SMR) device. In another embodiment, other types or configurations of data storage devices may be employed. The set of parity symbols may be stored in a data storage device or devices dedicated to storing parity symbols.

Method 1000 also includes, at 1050, generating a set of unique data chunks by deduplicating the outer precoded chunked data set. Method 1000 deduplicates the outer precoded chunked data set using a weak hash based deduplication approach.

Method 1000 also includes, at 1060, storing the set of unique data chunks in the cloud-based data storage system. The set of unique data chunks may be stored evenly across the cloud-based data storage system, or unevenly across the cloud-based data storage system. The set of unique data chunks may be stored in a data storage device dedicated to storing unique data chunks. Method 1000 may also store metadata associated with the set of unique data chunks in the cloud-based data storage system. In one embodiment, metadata associated with the set of unique data chunks includes a chunk size associated with a unique data chunk, a reference count associated with the unique data chunk, or other information associated with the unique data chunk.

Method 1000 also includes, at 1070, generating an inner precoded unique data set by precoding the set of unique data chunks with an inner precode. The inner precode generates an inner precoded unique data set comprising k' intermediate symbols from the set of unique data chunks, where the set of unique data chunks comprises k unique data symbols, where k and k' are integers, k' being greater than k.

Method 1000 also includes, at 1080 generating an erasure coded unique data set by erasure coding the inner precoded unique data set. Method 1000 generates the erasure encoded unique data set from the inner precoded unique data set using an UEP erasure coding approach.

Method 1000 further includes, at 1090, distributing the erasure coded unique data set across the cloud-based data storage system. The erasure coded unique data set may be distributed evenly across the cloud-based data storage system, or may be distributed unevenly according to a data protection policy. The erasure coded unique data set may be stored in a data storage device dedicated to storing erasure codes.

References to "one embodiment", "an embodiment", "one example", and "an example" indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable storage device", as used herein, refers to a non-transitory device that stores instructions or data. "Computer-readable storage device" does not refer to propagated signals. A computer-readable storage device may take forms, including, but not limited to, non-volatile media, and volatile media. Non-volatile media may include, for example, optical disks, magnetic disks, tapes, and other media. Volatile media may include, for example, semiconductor memories, dynamic memory, and other media. Common forms of a computer-readable storage device may include, but are not limited to, a floppy disk, a flexible disk, a hard disk, a magnetic tape, other magnetic medium, an application specific integrated circuit (ASIC), a compact disk (CD), other optical medium, a RAM, a ROM, a memory chip or card, a memory stick, and other media from which a computer, a processor or other electronic device can read.

"Circuit", as used herein, includes but is not limited to hardware, firmware, software in execution on a machine, or combinations of each to perform a function(s) or an action(s), or to cause a function or action from another circuit, method, or system. A circuit may include a software controlled microprocessor, a discrete circuit (e.g., ASIC), an analog circuit, a digital circuit, a programmed logic device, a memory device containing instructions, and other physical devices. A circuit may include one or more gates, combinations of gates, or other circuit components. Where multiple circuits are described, it may be possible to incorporate the multiple circuits into one circuit. Similarly, where a single circuit is described, it may be possible to distribute that single circuit between multiple physical circuits.

To the extent that the term "includes" or "including" is employed in the detailed description or the claims, it is intended to be inclusive in a manner similar to the term "comprising" as that term is interpreted when employed as a transitional word in a claim.

Throughout this specification and the claims that follow, unless the context requires otherwise, the words 'comprise' and 'include' and variations such as 'comprising' and 'including' will be understood to be terms of inclusion and not exclusion. For example, when such terms are used to refer to a stated integer or group of integers, such terms do not imply the exclusion of any other integer or group of integers.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

While example systems, methods, and other embodiments have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and other embodiments described herein. Therefore, the invention is not limited to the specific details, the representative apparatus, and illustrative examples shown and described. Thus, this application is intended to embrace alterations, modifications, and variations that fall within the scope of the appended claims.

What is claimed is:

1. A non-transitory computer-readable storage device storing computer executable instructions that when executed by a computer control the computer to perform a method for deduplicating and erasure coding a message, the method comprising:
   accessing the message,
   generating a set of message chunks by chunking the message using a first chunking approach;
   generating a set of outer-precoded parity symbols and a set of outer-precoded data symbols from the set of message chunks using an outer precode, where the outer precode is a low density parity check (LDPC) precode that uses an LDPC parity check matrix, where the LDPC parity check matrix has a column weight and a row weight;
   selectively adapting the LDPC parity check matrix by:
      computing a set of chunk statistics associated with a first set of erasure codes;
      generating a worst-case (WC) symbol characterization for a member of the first set of erasure codes based, at least in part, on a WC average number of symbol erasures or a WC average number of symbol errors;
      computing an average number of symbol errors for the first set of erasure codes based, at least in part, on a set of deduplication parameters, the set of chunk statistics, and the worst-case symbol characterization;
      choosing a column weight or a row weight such that a failure probability Pf is less than a decoding threshold;
      upon determining that there has been a change in a chunk pool:
         generating a new LDPC parity check matrix based, at least in part, on the column weight and the row weight; and
         replacing the LDPC parity check matrix with the new LDPC parity check matrix;
   storing the set of outer-precoded parity symbols in a data storage system;
   generating a set of unique data symbols by deduplicating the set of outer-precoded data symbols based, at least in part, on a chunk identification (ID) table;
   storing a copy of the set of unique data symbols in the data storage system;
   generating a set of inner-precoded data symbols from the set of unique data symbols using an inner-precode;
   generating the first set of erasure codes from the set of inner-precoded data symbols; and
   storing the first set of erasure codes in the data storage system.

2. The non-transitory computer-readable storage device of claim 1, where the chunk ID table stores a unique chunk ID associated with a unique data symbol stored in the data storage system, a chunk size associated with the unique data symbol, or a chunk reference count associated with the unique chunk ID, and where the chunk ID table is stored in a data storage device with a faster access time than the data storage system.

3. The non-transitory computer-readable storage device of claim 2, where the unique chunk ID is generated using a weak hash function.

4. The non-transitory computer-readable storage device of claim 2, where the unique chunk ID is a 16 bit cyclic redundancy check (CRC).

5. The non-transitory computer-readable storage device of claim 1, where the generating the first set of erasure codes comprises generating the first set of erasure codes using an unequal error protection (UEP) rateless Luby transform (LT) code based, at least in part, on the chunk ID table.

6. The non-transitory computer-readable storage device of claim 5, where generating the first set of erasure codes from the set of inner-precoded data symbols using the UEP LT code comprises generating a concatenated subset of inner-precoded data symbols by concatenating a subset of the set of inner-precoded data symbols, where a size of the subset of the set of inner-precoded data symbols is based, at least in part, on a data protection policy.

7. The non-transitory computer-readable storage device of claim 6, where generating the first set of erasure codes from the set of inner-precoded data symbols using the UEP LT code includes assigning a protection level to a member of the first set of erasure codes, where the protection level is based on a chunk size or a chunk reference count stored in the chunk ID table.

8. The non-transitory computer-readable storage device of claim 5, the method further comprising:
   generating a set of chunked outer-precoded parity symbols by chunking the set of outer-precoded parity symbols using a second chunking approach;
   generating a set of unique parity symbols by deduplicating the set of chunked outer-precoded parity symbols based, at least in part, on the chunk ID table; and
   storing the set of unique parity symbols in the data storage system.

9. The non-transitory computer-readable storage device of claim 8, the method further comprising:
   generating a second set of erasure codes from the set of unique parity symbols using the UEP LT code based, at least in part, on the chunk ID table; and
   storing the second set of erasure codes in the data storage system.

10. The non-transitory computer-readable storage device of claim 9, the method further comprising storing the copy of the set of unique data symbols, the first set of erasure codes, the set of unique parity symbols, or the second set of erasure codes, in a buffer.

11. The non-transitory computer-readable storage device of claim 8, where the second chunking approach is different than the first chunking approach.

12. The non-transitory computer-readable storage device of claim 1, where the set of outer-precoded parity symbols comprises a subset of outer-precoded parity symbols that is distinct from the set of outer-precoded data symbols.

13. The non-transitory computer-readable storage device of claim 1, where the column weight is three and the row weight is 47.

14. The non-transitory computer-readable storage device of claim 1, where the outer precode comprises a cyclic redundancy check (CRC) code.

15. The non-transitory computer-readable storage device of claim 1, the method further comprising generating a reconstructed message by decoding the first set of erasure codes.

16. The non-transitory computer-readable storage device of claim 15, where generating the reconstructed message includes performing a CRC on a decoded member of the first set of erasure codes.

17. The non-transitory computer-readable storage device of claim 1, where the first chunking approach is a variable length chunking approach, or a two-thresholds two divisors chunking approach.

18. An apparatus for deduplicating and erasure coding a message, the apparatus comprising:
a processor;
a data storage system;
a memory that stores a chunk index (ID) table;
a set of circuits; and
an interface that connects the processor, the memory, the data storage system, and the set of circuits, the set of circuits comprising:
a first chunking circuit that generates a set of data chunks from the message using a variable length chunking approach;
an outer precoding circuit that generates a set of precoded data chunks and a set of parity symbols from the set of data chunks using a low density parity check (LDPC) code that uses an LDPC parity check matrix, where the LDPC parity check matrix has a column weight and a row weight, where the outer precoding circuit selectively adapts the LDPC parity check matrix by:
computing a set of chunk statistics associated with a first set of erasure codes;
generating a worst-case (WC) symbol characterization for a member of the first set of erasure codes based, at least in part, on a WC average number of symbol erasures or a WC average number of symbol errors;
computing an average number of symbol errors for the first set of erasure codes based, at least in part, on a set of deduplication parameters, the set of chunk statistics, and the worst-case symbol characterization;
choosing a column weight or a row weight such that a failure probability Pf is less than a decoding threshold;
upon determining that there has been a change in a chunk pool, the outer precoding circuit is further configured to:
generate a new LDPC parity check matrix based, at least in part, on the column weight and the row weight; and
replace the LDPC parity check matrix with the new LDPC parity check matrix;
a second chunking circuit that generates a set of chunked parity symbols from the set of parity symbols using the variable length chunking approach;
a deduplication circuit that generates a set of unique deduplicated data chunks by deduplicating the set of precoded chunks or the set of chunked parity symbols based, at least in part, on the chunk ID table;
an unequal erasure protection (UEP) circuit that generates an encoded message from the set of deduplicated data chunks; and
a storage circuit that controls the data storage system to store the set of deduplicated data chunks, the set of parity symbols, or the encoded message in the data storage system.

19. The apparatus of claim 18, where the first chunking circuit and the second chunking circuit use a weak hash based variable length chunking approach or a two-thresholds, two-divisors chunking approach.

20. The apparatus of claim 18, where the first chunking circuit uses a first chunking approach, and the second chunking circuit uses a second, different chunking approach.

21. The apparatus of claim 18, where the chunk ID table stores a chunk ID associated with a unique data chunk stored in the data storage system, a reference count associated with the chunk ID associated with the unique data chunk, or a chunk size associated with the chunk associated with the chunk ID.

22. The apparatus of claim 21, where the LDPC code uses an LDPC parity check matrix, where the outer precoding circuit selectively adapts the LDPC parity check matrix as a function of a worst case average number of symbol erasures, a worst case average number of symbol errors, a length of a chunk ID, a change in the set of deduplicated data chunks, a change in the set of parity symbols, or a change in the set of erasure codes stored in the data storage system.

23. The apparatus of claim 18, where the UEP circuit generates the encoded message using an inner precode and a Luby transform (LT) base code, where a level of erasure protection provided by the UEP circuit is based on a chunk size or a chunk reference count stored in the chunk ID table.

24. The apparatus of claim 23, where the UEP circuit selectively dynamically adapts the level of erasure protection provided by the UEP circuit by adjusting the LT base code, a number of deduplicated data chunks to be encoded, a number of coded units generated from the number of deduplicated data chunks, a number of parity units generated from the number of deduplicated data chunks, a word size associated with the LT base code, a packet size associated with the LT base code, a symbol size associated with the LT base code, a buffer size of a member of the data storage system, a decoder failure probability, a coding parameter for an online coding technique, a coding overhead for a Fountain coding technique, a degree distribution for a Fountain coding technique, a precode rate for a Fountain coding technique, a level of hardware acceleration used by the UEP circuit, or a level of hardware parallelism used by the UEP circuit.

25. The apparatus of claim 18, where the storage circuit controls the data storage system to store the set of deduplicated data chunks in a first buffer, and the set of parity symbols or the encoded message in a second, different buffer.

26. The apparatus of claim 18, where the set of circuits further comprises a decoding circuit that reconstructs the message based on the set of deduplicated data chunks, the set of parity symbols, or the encoded message.

27. A method comprising:
accessing a data set;
generating a chunked data set by chunking the data set;
generating an outer precoded chunked data set and a set of parity symbols by precoding the chunked data set using an outer precode, where the outer precode is a low density parity check (LDPC) precode that uses an LDPC parity check matrix, where the LDPC parity check matrix has a column weight and a row weight;
selectively adapting the LDPC parity check matrix by:
computing a set of chunk statistics associated with an erasure coded unique data set;
generating a worst-case (WC) symbol characterization for a member of the erasure coded unique data set, at least in part, on a WC average number of symbol erasures or a WC average number of symbol errors;
computing an average number of symbol errors for the erasure coded unique data set based, at least in part, on a set of deduplication parameters, the set of chunk statistics, and the worst-case symbol characterization;
choosing a column weight or a row weight such that a failure probability Pf is less than a decoding threshold;

upon determining that there has been a change in a chunk pool:
    generating a new LDPC parity check matrix based, at least in part, on the column weight and the row weight; and
    replacing the LDPC parity check matrix with the new LDPC parity check matrix;
storing the set of parity symbols in a cloud-based data storage system;
generating a set of unique data chunks by deduplicating the outer precoded chunked data set;
storing the set of unique data chunks in the cloud-based data storage system;
generating an inner precoded unique data set by precoding the set of unique data chunks with an inner precode;
generating the erasure coded unique data set by erasure coding the inner precoded unique data set; and
distributing the erasure coded unique data set across the cloud-based data storage system.

\* \* \* \* \*